United States Patent [19]

Kamada

[11] Patent Number: 5,621,740
[45] Date of Patent: Apr. 15, 1997

[54] OUTPUT PAD CIRCUIT FOR DETECTING SHORT FAULTS IN INTEGRATED CIRCUITS

[75] Inventor: Takehiro Kamada, Osaka, Japan

[73] Assignee: Matsushita Electric Industrial Co., Ltd., Osaka, Japan

[21] Appl. No.: 242,673

[22] Filed: May 13, 1994

Related U.S. Application Data

[63] Continuation-in-part of Ser. No. 155,168, Nov. 19, 1993, Pat. No. 5,450,415.

[30] Foreign Application Priority Data

May 14, 1993 [JP] Japan ................................ 5-112843

[51] Int. Cl.$^6$ ................................................ G01R 31/28
[52] U.S. Cl. .................................... 371/22.3; 371/22.1
[58] Field of Search ................................ 371/22.3, 22.5, 371/22.6, 22.1; 328/83.87, 55, 66; 307/270, 443

[56] References Cited

U.S. PATENT DOCUMENTS

| 4,298,980 | 11/1981 | Hajdu et al. | 371/25 |
|---|---|---|---|
| 5,084,874 | 1/1992 | Whetsel, Jr. | 371/22.3 |
| 5,107,230 | 4/1992 | King | 324/158 R |
| 5,134,311 | 7/1992 | Biber et al. | 307/270 |
| 5,450,415 | 9/1995 | Kamada | 371/22.3 |
| 5,486,778 | 1/1996 | Lou | 325/71 |

OTHER PUBLICATIONS

Carver Mead, "ALU Registers", *Introduction to VLSI System* text book, 2nd printing, Oct. 1980, pp. 155–157.

*Primary Examiner*—Hoa T. Nguyen
*Attorney, Agent, or Firm*—McDermott, Will & Emery

[57] ABSTRACT

Provided with an integrated circuit are plural output pad circuits being connected to wires by way of an output pin. Each output pad circuit comprises an input section for taking in an external test signal; a generator, connected to an output of the input section, for generating a signal whose logic value is the same as the logic value of a signal from the input section; a controller for controlling the generator; and a measurement section for measuring the logic value of a signal from the generator. The controller controls the generator in order that a logic 1 signal and a logic 0 signal generated by the generator have different electric current levels in the test operation mode. If there occurs a short between a wire being connected to an output pad circuit that receives a logic 1 signal and a wire being connected to an output pad circuit that receives a logic 0 signal, then signals from these output pad circuits will have the logic value of one of the logic 1 signal and the logic 0 signal that has a higher electric current level than the other. On the other hand, in the normal operation mode, the generator generates both a logic 1 signal and a logic 0 signal at the same electric current level so as to balance the electric current level.

10 Claims, 24 Drawing Sheets

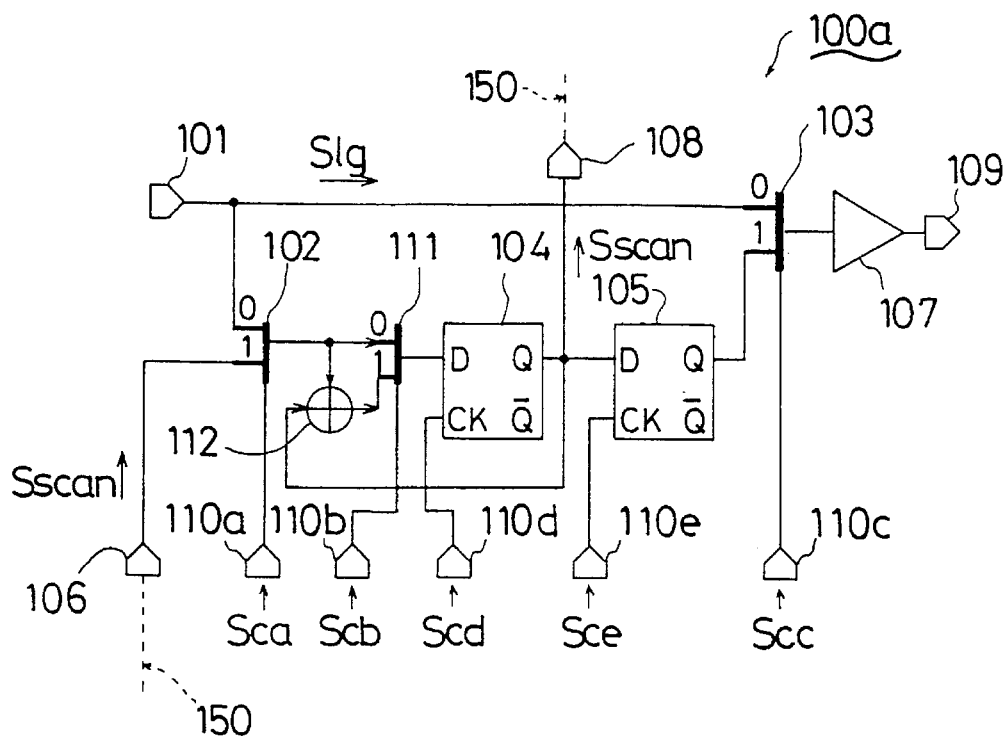

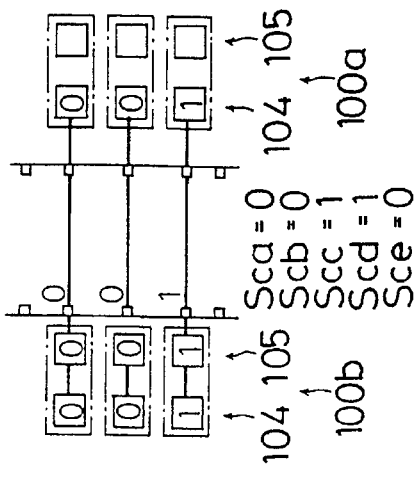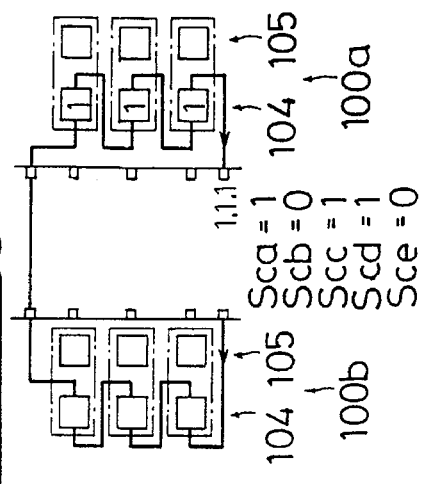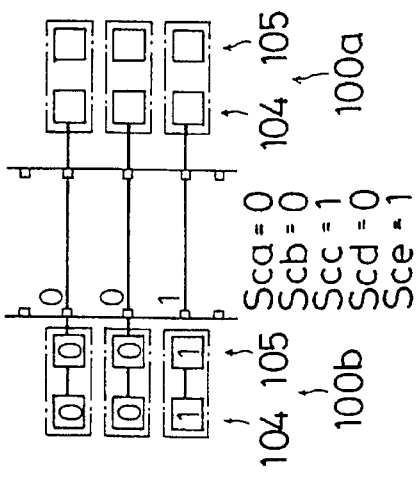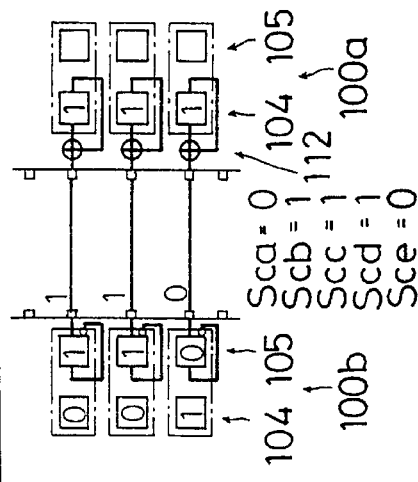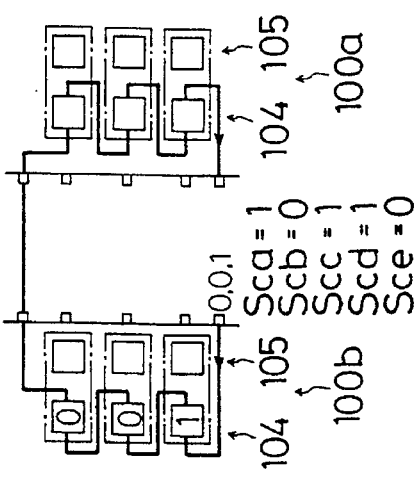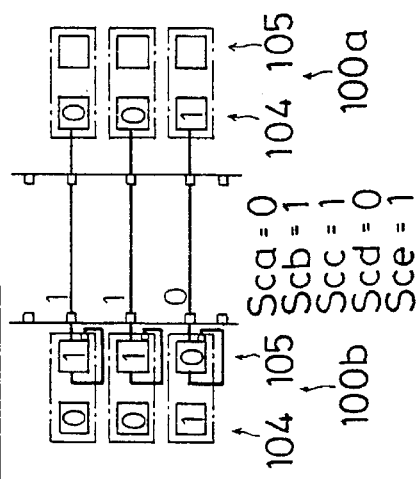

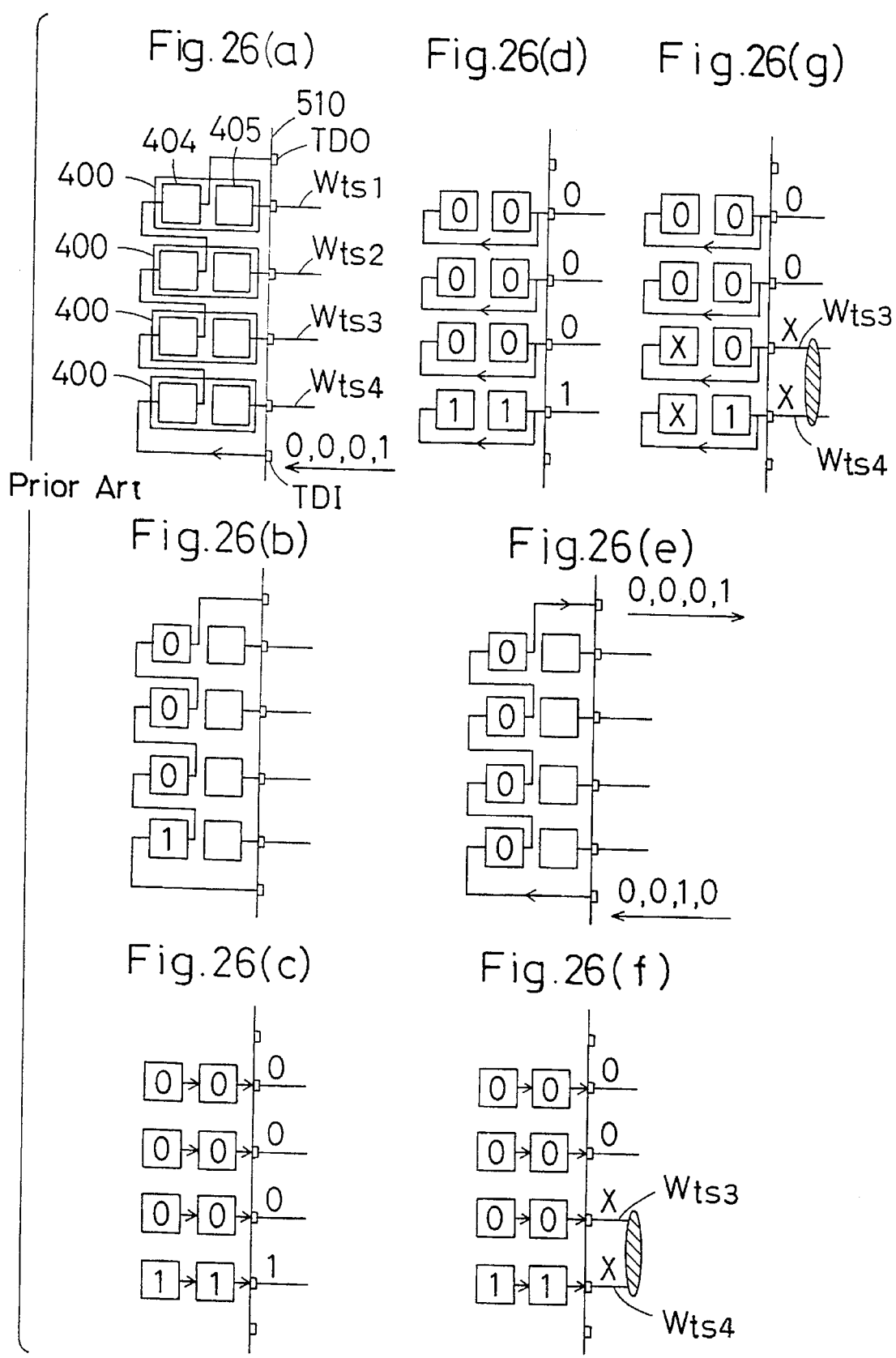

OUTPUT PAD CIRCUIT FOR DETECTING SHORT FAULTS IN INTEGRATED CIRCUITS

This application is a Continuation-In-Part of application Ser. No. 08/155,168, filed 19 Nov. 1993, which issued as U.S. Pat. No. 5,450,415 on Sep. 12, 1995.

BACKGROUND OF THE INVENTION

This invention pertains to boundary scan cell circuits (BSCC) provided in a corresponding manner to I/O pins of an integrated circuit (IC), to boundary scan test circuits (BSTC) for use in checking an inter-IC wiring subjected to testing for connection failures, and to a boundary scan testing. This invention pertains to an output pad circuit capable of improving the efficiency of detection for short-circuited wires being connected to respective output pins in the integrated circuit.

Boundary scan testing has been developed as an attractive solution to problems accompanied with in-board wiring test techniques for checking, for example, printed circuit boards for the presence or absence of connection faulty. The accessing method as to boundary scan testing is standardized by IEEE1149.1. By referring to FIGS. 21-24, a BSCC structure conforming to IEEE1149.1 as well as a boundary scan test circuit structure for use in checking wire interconnection condition between on-board components by the use of an IEEE1149.1 BSCC is described.

FIG. 21 illustrates the organization of a boundary scan test circuit 200 employing a plurality of BSCCs. Provided on a printed circuit board are a plurality of ICs 210, 220, 230, and so on. The IC 210 (220, 230) comprises the following main components: a TAP controller (not shown in the figure) for controlling the operation of BSTC in-IC units; a plurality of connection terminals 215 (225, 235) for signal transfer between the ICs; and a plurality of BSCCs 100 (100, 100) the number of which is equal to the number of the connection terminals 215 (225, 235), each BSCC 100 being provided between an internal logic 212 (222, 232) and each connection terminal 215. In FIG. 21, connected between each connection terminal 215 and each connection terminal 225, between each connection terminal 225 and each connection terminal 235 between each connection terminal 235 and each connection terminal 215 are target wires $W_{ts}$ which are signal lines subjected to testing. As a result of such arrangement, a particular wire $W_{ts}$ is checked for connection failures such as disconnection according to the signal state. All of the BSCCs 100 are connected with one another in series, and a scan path 150 is provided in such a way that a scan signal $S_{scan}$ can pass through every IC. When checking $W_{ts}$ for stuck-at faults, a test logic signal (i.e. test data) is applied to a BSCC 100 through the scan path 150, which is hereinafter termed as "scan-in", whereas a logic signal (i.e. a result of the test) that has entered a BSCC 100 over $W_{ts}$ is output through the scan path 150, which is hereinafter termed as "scan-out". FIG. 21 shows various terminals. TDO is a scan signal output terminal at which $S_{scan}$ signal from the IC 220 is output. TDI is a scan signal input terminal at which $S_{scan}$ signal is input. TCK is a clock signal input terminal at which a clock signal is input. TMS is a test mode selection signal input terminal at which a test mode selection signal is input. TRST is a reset signal input terminal at which a reset signal is input.

By making reference to FIG. 22, the organization of the conventional BSCC 100 conforming to IEEE1149.1 is described. As shown in FIG. 22, the BSCC 100 comprises a first selector 102 which accepts two different input signals thereby outputting one of these two input signals according to a control signal $S_{ca}$, a second selector 103 which also accepts two different input signals thereby outputting one of these two input signals according to a control signal $S_{cc}$, a first flip-flop 104 which operates in synchronism with a clock signal $S_{cd}$, a second flip-flop 105 which also operates in synchronism with a clock signal $S_{ce}$, and a buffer 107 which gives a logic "1" output or a logic "0" output, these two logic outputs having the same drive power. In addition to the foregoing components, the BSCC 100 has a logic signal input terminal 101 at which a logic signal enters the BSCC 100, a scan signal input terminal 106 at which $S_{scan}$ scan signal from the scan path 150 enters the BSCC 100, control terminals 110a, 110c, 110d, and 110e at which $S_{ca}$ control signal, $S_{cc}$ control signal, $S_{cd}$ clock signal, and $S_{ce}$ clock signal are respectively input to the BSCC 100, a scan signal output terminal 108 at which $S_{scan}$ scan signal is sent out down to the scan path 150, and a logic signal output terminal 109 at which a logic signal leaves the BSCC 100.

Of the two input signals to the first selector 102, one is a logic signal $S_{lg}$ from the logic signal input terminal 101 and the other is $S_{scan}$ scan signal from the scan signal input terminal 106. The first selector 102 gives its output to the first flip-flop 104. The first flip-flop 104 outputs to the second flip-flop 105. Of the two input signals to the second selector 103, one is $S_{lg}$ logic signal from the logic signal input terminal 101 and the other is the output of the second flip-flop 105. The second selector 103 gives its output to the buffer 107. The output of the buffer 107 is applied to the logic signal output terminal 109 at which it leaves the BSCC 100. The BSCC 100 may be provided on the input side or on the output side, however, the basic structure of the BSCC 100 will not change with respect to the layout location.

FIG. 23 shows an interconnection of a BSCC 100 of the IC 210 serving as an output BSCC with a BSCC 100 of the IC 220 serving as an input BSCC. In the IC 210, the logic signal input terminal 101 is connected to the internal logic 212 and the logic signal output terminal 109 is connected to the connection terminal 215 which is an output pin. In the IC 220, on the other hand, the logic signal input terminal 101 is connected to the connection terminal 225 that is an input pin and the logic signal output terminal 109 is connected to the internal logic 222.

If the first selector 102 of the BSCC 100 in the first IC 210 selects $S_{scan}$ scan signal according to the logic state of $S_{ca}$ control signal, this serially connects all the first flip-flops 104 within the first IC 210. $S_{scan}$ scan signal is output at the TDO terminal. Thereafter, $S_{scan}$ scan signal is sequentially applied to the IC 210, to the IC 220, and so on through their respective scan signal input terminals 106, and is output at their respective scan output terminals 108.

How the boundary scan test circuit 200 checks $W_{ts}$ for stuck-at "0" faults is explained.

A logic value of "1" is pre-stored, by issuing a SAMPLE/PRELOAD instruction, in the second flip-flop 105 of the BSCC 100 of the IC 210. Then, an EXTEST instruction is executed. This changes the logic value of Scc control signal to a logic "1" and a "1" is output at the connection terminal 215. FIG. 24 is the state transition diagram of a TAP controller to IEEE1149.1. When the TAP controller is in the "Capture-DR" state, $S_{ca}$ control signal comes to have a logic value of "0", and a logic value (i.e. a result of the testing), passing through $W_{ts}$, is latched by the first flip-flop 104 of the input BSCC 100 of the IC 220. Next, when the TAP controller is in the "Shift-DR" state, $S_{ca}$ control signal comes to have a logic value of "1" and the scan path 150 enters the communication state while at the same time that logic value latched by the first flip-flop 104 is scanned-out. Of all the serial data scanned-out, a logic value string (i.e. a result of the testing) is checked against the input test data "1" so as to check $W_{ts}$ for the presence or absence of stuck-at "0" faults. For the case of checking $W_{ts}$ for stuck-at "1" faults, the output BSCC 100 outputs a logic value of "0" and the input BSCC 100 scans-out a test result to the scan path 150.

To sum up, if a logic value received by the input BSCC 100 through $W_{ts}$ matches one provided by the output BSCC 100, this indicates that the connection state of $W_{ts}$ is good. If the input BSCC 100 receives a logic value of "0" although the output BSCC 100 provides a logic value of "1", this is indicative of the occurrence of stuck-at "0" faults. Conversely, if output of a logic value of "0" results in input of logic value of "1", this is indicative of the occurrence of stuck-at "1" faults.

In general, two different test data items are required to perform the above-described stuck-at "0"/"1" fault testing, namely one formed by a particular logic value string and the other formed by inverting that particular logic value string. More specifically, in the case of making an output BSCC provide test data items of "0", "0", "0", "1", . . . onto a wire subjected to testing, it is necessary to apply test data items of "1", "1", "1", "0", . . . to that output BSCC. Meanwhile, upon receiving a logic signal over the wire, an input BSCC must supply both a test result against the non-inverted test data and another test result against the inverted test data onto a scan path. Accordingly, if wires subjected to testing total to N, the number of shift operation cycles is 4N cycles when performing stuck-at "0"/"1" fault testing. This produces a problem that as the I/O pin count (i.e. the wire count) increases testing time dramatically increases.

U.S. Pat. No. 5,084,874 shows a BSCC that comprises an input logic, a multiplexer capable of selecting between signals, a First and a second flip-flop for latching a signal from the multiplexer for a predetermined length of time, wherein the multiplexer and these two flip-flops are connected in series and the inverted output of the second flip-flop is fed back to the multiplexer. In such a prior art BSCC, however, since signals to a logic signal output terminal are always provided via the multiplexer and two flip-flops, this requires capture cycles For outputting the inversion logic to a logic signal output terminal. For this reason, testing circuitry becomes complicated since the way of controlling multiplexers is different between an input BSCC and an output BSCC. Therefore, the prior art techniques have difficulties in reducing testing time.

One way of testing wiring by means of a boundary-scan test circuit conforming to IEEE Std 1149.1 is described by reference to the drawings. Shown in FIG. 25 is an integrated circuit (IC) 510 having plural output pad circuits each of which is reference-numbered 400. Each one of the output pad circuits 400 is connected to a respective output pin 515 and comprises these components: a first selector 402, a second selector 403, a first flip-flop 404, a second flip-flop 405, and a buffer 407. The buffer 407 provides logic 1/0 outputs having the same driving capability. The buffer 407 receives the output from the second selector 403 that is controlled by a control signal $S_{cg}$. The second selector 403 receives a logic signal $S_{lg}$ from an internal logic 512 and the output from the second flip-flop 405. The second flip-flop 405 receives the output from the first flip-flop 404. A scan output terminal 408 also receives the output from the first flip-flop 404 and provides such received output as a scan signal $S_{scan}$. The first selector 402 that is controlled by a control signal $S_{cf}$ receives the output from the buffer 407 and the output from a scan output terminal 408. The first flip-flop 404 receives the output from the first selector 402.

The operation of the output pad circuit 400 is described. If $S_{cf}$ gives an order for $S_{scan}$ to be selected, then, for example, all of the flip-flops 404 within the IC 510 are serially interconnected on a scan path 550. Therefore, an output pad circuit 400 being connected first on the scan path 550 receives a signal from a scan input pin TDI, and the output of the flip-flop 404 of an output pad circuit 400 being connected last on the scan path 550 is applied to a scan output pin TDO. Such arrangement allows any logic value to be applied by a scan operation to each output pad circuit 400 from outside the IC 510 and further enables the scanning-out of logic values pre-stored in the flip-flops. An arbitrary logic value is applied to the first flip-flop 404, stored by the second flip-flop 405, and provided by $S_{cg}$ by way of the buffer 407. The output of the buffer 407 is fed by $S_{cf}$ to the first flip-flop 404 and the first flip-flop 404 is made to store the output logic value at given timing. The first selector 402 is again controlled by $S_{cf}$ so as to form a scan path and the stored logic value is output at the output terminal to outside the IC 510.

The operation of checking for short-circuited wiring is now described. FIG. 26 is comprised of FIGS. 26a–26f each of which schematically shows a conventional output pad circuit 400 within the IC 510. For the sake of easy understanding, only four (4) first flip-flops 404 and four (4) buffers 407 are shown. In FIG. 26, both the output logic value of each first flip-flop 404 and the input logic value of each buffer 407 are represented by "0" and "1". As shown in FIG. 26a, a scan path is formed by $S_{cf}$ and a test pattern of 0001 is input at TDI. This allows each first flip-flop 404 to hold a respective logic value (see FIG. 26b). Next, the first flip-flops 404 output their respective logic values to the corresponding buffers 407. The buffers 407 then output the received logic signals to respective wires $W_{ts1}$–$W_{ts4}$ (see FIG. 26c). Then, these logic values of $W_{ts1}$–$W_{ts4}$ are measured by the first flip-flops 404 (FIG. 26d), and the measured logic values should correspond to the initial test pattern if there is no faulty. Next, a scan path is formed for scanning-out the result of the measuring operation (i.e., 0001) to outside the IC 510 while at the same time scanning-in the next test pattern of 0010 (FIG. 26e). The scanned-out result is compared with an expected value of 0001 for examination.

The organization described above, however, produces some problems. For example, if there is a short between $W_{ts3}$ and $W_{ts4}$ as shown in FIG. 26f, the electric potential is an intermediate electric potential. As a result, logic values being measured become undefined (see FIG. 26g). Therefore, even if short circuiting occurs between wires, the same logic value as the expected value (i.e., 0001) is likely to be measured. This lowers the efficiency of fault detection.

In order to detect short-circuiting between output pins, a particular output pin is made to be logic 1 (or logic 0), whereas the remaining output pins are made to be logic 0 (or logic 1). Therefore, when making a check for short-circuiting, the output pin being examined must be changed sequentially. For example, if the number of output pins is N, then N expected-value patterns must be prepared. This produces the problem that the length of patterns is increased in the case of integrated circuits with a great number of pins.

SUMMARY OF THE INVENTION

Bearing in mind the above-described problems accompanied with the prior art techniques, the present invention was made. It is a first object of the present invention to reduce boundary scan testing time. More specifically, in an input BSCC, a current logic output (i.e. a current test result) is XORed with a previous logic output (i.e. a previous test result) so as to reduce the cycle count necessary for scan-out of the test result with given test data. It is a second object of the present invention to reduce boundary scan testing time by providing a means capable of inverting test data thereby saving cycles required for scan-in of test data. It is a third object of the present invention to provide an improved output pad circuit in which the electric current level is made to vary with respect to the output logic value. Therefore, even when there occurs a short fault to a wire being connected to an output pin, the fault detection efficiency can be improved and the number of test patterns required can be reduced by compressing the measurement result.

In order to accomplish the first object, the present invention discloses a First BSCC. This BSCC comprises the following components:

(a) a logic signal input terminal at which an external logic signal enters the boundary scan cell circuit;

(b) a scan signal input terminal at which an external scan signal enters the boundary scan cell circuit;

(c) a scan signal output terminal at which a scan signal leaves the boundary scan cell circuit;

(d) an input logic signal storage which latches a logic signal from the logic signal input terminal for a predetermined length of time and outputs it;

(e) an XOR generator which generates the XOR of a logic signal from the input logic signal storage with a delay of a predetermined length of time and a current logic signal from the logic signal input terminal; and (f) a scan selector which selects one of a scan signal from the scan signal input terminal and an XOR signal from the XOR generator according to the logic state of a control signal and outputs a signal thus selected to outside the boundary scan cell circuit through the scan signal output terminal.

As a result of such an arrangement, if a current logic signal from the logic signal input terminal and a previous logic signal have the same logic value. the XOR generator gives an XOR sum of "0". If they differ with each other in logic value, an XOR sum of "1" is generated by the XOR generator. Therefore, in a stuck-at "0"/"1" fault testing in which if a target wire suffers from no failures, a logic signal input terminal should be fed alternately non-inverted logic signals and inverted logic signals through the target wire, if the XOR generator produces an XOR sum of "1", this indicates that no interconnection failures are found, whereas if the XOR generator produces an XOR sum of "0", this indicates that interconnection failures are existent. Such an XOR sum is scanned-out at the scan signal output terminal. Therefore, when performing stuck-at "0"/"1" fault testing, scan-out of both a test result with initial test data and a test result with an inverted test data becomes unnecessary. In other words, it is possible to carry out stuck-at "0"/"1" fault testing by performing the XOR addition of these two test results and by scanning-out only a resulting XOR sum. Accordingly, if this type of BSCC is disposed on the side at which a test signal via a target wire is input, the number of cycles required for scan-out of the result of the test can be reduced.

Preferably, the first BSCC further includes:

an input signal selector which selects one of a logic signal from the logic signal input terminal and a scan signal from the scan signal input terminal according to the logic state of a control signal and outputs a signal thus selected to the XOR generator;

wherein:

(a) the scan selector's input is connected to the input signal selector's output as well as to the XOR generator's output;

(b) the input logic signal storage, formed by a flip-flop for holding an input logic signal whose input is connected to the scan selector's output and whose output is connected to the scan signal output terminal, outputs one of an input logic signal and an XOR signal according to the logic state of a clock signal; and (c) the scan signal output terminal is connected to a non-inverting output terminal of the flip-flop.

As a result of such an arrangement, when a logic signal from the logic signal input terminal is selected by the input signal selector, such a logic signal will be latched by the flip-flop for a predetermined length of time according to the logical value of a clock signal, thereafter being applied to the XOR generator at which it is compared with a new logic signal from the logic signal input terminal. In this way, an XOR sum, used for checking for wire stuck-at faults, is generated. Conversely, if a scan signal is selected by the input signal selector, such a scan signal, passing through the scan selector and through the flip-flop, is output at the scan signal output terminal. Input and output of a scan signal to and from a BSCC is timed by a clock signal for synchronization, whereby the wiring testing can be carried out smoothly.

In order to accomplish the second object, the present invention discloses a second BSCC. This BSCC comprises the following components:

(a) a logic signal output terminal at which a logic signal is output, (b) a scan signal input terminal at which an external scan signal enters the boundary scan cell circuit;

(c) a scan signal output terminal at which a scan signal leaves the boundary scan cell circuit;

(d) an input scan signal storage which latches a scan signal from the scan signal input terminal for a predetermined length of time and outputs it;

(e) an inversion signal generator which accepts the output of the input scan signal storage and inverts it to give an inverted scan signal;

(f) an input signal selector whose input is connected to the scan signal input terminal as well as to the inversion signal generator and whose output is connected to the input scan signal storage, the input signal selector alternately selecting an input scan signal from the scan signal input terminal and an inverted scan signal from the inversion signal generator according to the logic state of a control signal and outputting a signal thus selected; and (g) an alternate signal output unit which latches a signal selected by the input signal selector for a predetermined length of time and outputs it to outside the boundary scan cell circuit through the logic signal output terminal;

wherein the scan signal output terminal is connected to a signal line between the scan signal input terminal and the input signal selector.

As a result of such an arrangement, the input signal selector alternately selects input scan signals and their inversions. Then, these two other signals leave the BSCC one after the other under control of the alternate signal output unit. If such a BSCC is disposed on the side at which test data being supplied to a target wire is output and a certain test data item is applied to the BSCC via the scan signal input terminal, this automatically produces the inverted logic value of that test data item within the BSCC. Then, test data items and their logic inversions are alternately provided at the logic signal output terminal and applied to the wire. This saves cycles necessary for scan-in of the inversion logic value of test data.

Although the output of the inversion signal generator is fed back to the input signal selector, the output to the scan path will not interfere with the inversion signal because the scan signal output terminal is connected to a signal line between the input signal selector and the scan signal input terminal. Once test data is input, it is maintained for reuse. Therefore, the number of shift operation cycles required for scan-out of test data can be reduced, thereby reducing the time taken for providing test data and its inversion logic value.

Preferably, in the second BSCC:

(a) the input scan signal storage, inversion signal generator, and alternate signal output unit are formed by a single flip-flop for holding an input scan signal having a non-inverting output terminal and an inverting output terminal, the flip-flop being capable of outputting the non-inverted signal of an input signal through the non-inverting output terminal or the inverted signal of an input signal through the inverting output terminal according to the logic state of a clock signal;

(b) the logic signal output terminal is connected to the non-inverting output terminal of the flip-flop; and (c) the input signal selector is a selector whose input is connected to the scan signal input terminal as well as to the inverting output terminal of the flip-flop and whose output is connected to an input terminal of the flip-flop.

As a result of such an arrangement, a single flip-flop concurrently serves as an input scan signal storage, as an inversion signal generator, and as an alternate signal output unit. Therefore, with such a simplified structure, the production of the inversion logic value of test data and the alternate output of test data and its inversion logic value become possible.

Further, a single BSCC may have both the first BSCC's configuration and the second BSCC's configuration. As a result, such a BSCC comes to have advantages of both the first and second BSCCs.

If every BSCC has both the first BSCC's configuration and the second BSCC's configuration, this lowers production costs by changing the function of the BSCCs with respect to their layout location.

The present invention discloses a boundary scan test circuit which comprises the following components:

(a) a plurality of integrated circuits each of which has an internal logic, an input pin at which an external logic signal enters the internal logic, and an output pin at which a logic signal leaves the internal logic;

(b) a wire mount, disposed between the input pin of any one of the plurality of integrated circuits and the output pin of the other integrated circuit, onto which a wire, subjected to interconnection testing, is mounted;

(c) input boundary scan cell circuits each disposed between the input pin of each of the plurality of integrated circuits and the internal logic of each of the plurality of integrated circuits;

(d) output boundary scan cell circuits each disposed between the output pin of each of the plurality of integrated circuits and the internal logic of each of the plurality of integrated circuits; and (e) a scan path for connecting the boundary scan cell circuits in series.

This boundary scan test circuit employs the above-described first BSCCs as input BSCCs.

As a result of such an arrangement, when performing stuck-at "0"/"1" fault testing with a target wire subjected to testing, the number of cycles necessary for scan-out of the result of the test through the scan path can be reduced. In other words, if the number of target wires=N, the number of cycles for scanning-out the result of the test can be reduced down to N cycles.

Additionally, the present invention discloses a modification of the above-described boundary scan test circuit in which, as output BSCCs, the above-described second BSCCs are employed.

As a result of such an arrangement, cycles for scan-in of the inversion logic value of a test data item to an output BSCC become unnecessary. In other words, if the number of target wires=N, the number of cycles necessary for scan-in of test data can be reduced down to N cycles.

Conventionally, 4N cycles are required for shift operation, however, the present invention reduces it down to 2N cycles.

In order to accomplish the third object, the present invention provides a first output pad circuit. This output pad circuit comprises:

(a) input means for receiving a logic signal of first logic or a logic signal of second logic from the outside of the output pad circuit, (b) a variable signal-current-level generator, connected to an output of the input means, for generating a logic signal identical in logic value with the logic signal from the input means, and (c) a controller for exerting control in order that the generator generates a first logic signal and a second logic signal at different electric current levels.

Wires being tested are connected to outputs of the output pad circuits based on the present invention, and if there is a short between specified wires one of which is connected to an output pad circuit whose logic output is generated at a low electric current level and the other of which is connected to an output pad circuit whose logic output is generated at a high electric current level, the former output pad circuit will provide an output signal whose logic value is identical to that of an output signal from the latter output pad circuit. Such a short is effectively detected because of the difference in logic value between the input signal and the output signal. Therefore, the short fault detection efficiency is improved.

It is preferable to dispose in the output pad circuit a measurement means used for measuring the logic value of signals from the generator.

Such an arrangement permits the detecting of short faults to be performed within the output pad circuit.

The present invention discloses a test circuit for the testing of wiring employing the above-described output pad circuit.

More specifically, the present invention provides a test circuit for the testing of a wire connecting between integrated circuits. This test circuit comprises:

(a) an internal logic circuit, incorporated in the integrated circuit, for generating either an internal logic signal of first logic or an internal logic signal of second logic, (b) test signal generation means for generating either a test signal of first logic or a test signal of second logic, (c) a plurality of output pad circuits, incorporated in the integrated circuit and connected to an output of the internal logic circuit as well as to an output of the test signal generation means, for generating given logic signals, (d) an output pin, connected to the wire as well as to the output pad circuit, for applying the logic signal generated by the output pad circuit to the wire, and (e) measurement means for measuring the logic value of the logic signal from the output pad circuit, wherein the each output pad circuit comprises:
(i) a logic input terminal connected to the internal logic,
(ii) input means for alternatively inputting the internal logic signal and the test signal according to a mode-switch control signal for the switching of a test operation mode and a normal operation mode,
(iii) a variable signal-current-level generator, connected to an output of the input means, for generating a logic signal identical in logic value with the logic signal from the input means,
(iv) a controller for exerting control in order that the generator generates a first logic signal and a second logic signal at different electric current levels, and
(v) a logic output terminal connected to the generator as well as to the output pin.

If there occurs short-circuiting between a wire connected to an output pad circuit that provides an output signal of a first logic and a wire connected to an output pad circuit that provides an output signal of a second logic, then the potential of these wires is bound to be the higher in electric current level of these two logic values because of the difference in electric current level between the output signals. The measuring means measures the logic value of signals from the generator for comparison with the logic value of input signals and short-circuiting between wiring is bound to be detected, that is, the short fault detection efficiency will improve.

It is preferable for the present output pad circuit to use the following structures.

The controller is designed such a way that it, in response to a normal operation mode signal, controls the generator in order that the generator generates a first logic signal and a second logic signal at the same electric current level.

In the normal operation mode, the generator provides a first logic signal and a second logic signal at the same electric current level. This maintains the balance of different signals (i.e., the balance of a first logic signal and a second logic signal) thereby making it possible for the normal operation to be done smoothly.

It is preferable that the test circuit is a boundary-scan test circuit, that each output pad circuit comprises a scan input terminal at which a scan signal is input and a scan output terminal at which the scan signal is output, and that a scan path is formed which sequentially connects the scan input terminals and the scan output terminals of the output pad circuits in series.

This simplifies the structure of wiring and improves the short faulty detection efficiency.

The present invention provides a test circuit, wherein:

(a) a control signal to the controller is a test operation mode selection signal for the switching of a test operation mode and a normal operation mode of the output pad circuit, (b) the controller receives the output from the input means and the test operation mode selection signal, thereby the controller generating a signal of given logic "A" if the output from the input means is a second logic signal and the test operation mode selection signal is indicative of a normal operation mode, otherwise the controller generating a signal of the reverse of logic "A", and (c) the generator comprises:
(i) a first generation section, connected to an output of the input means, for generating either a first logic signal at a first electric current level if the input means provides a first logic signal or a second logic signal at a second electric current level distinctively lower than the first electric current level if the input means provides a second logic signal, and
(ii) a second generation section, connected to an output of the controller, for generating either an electric current equivalent to a difference between the first electric current level and the second electric current level if the controller provides a signal of logic "A" or a high impedance if the controller provides a signal of the reverse of logic "A".

If the test operation mode selection signal is indicative of the normal operation mode, the generator provides a first logic signal and a second logic signal at the same electric current level (i.e., the first electric current level). Accordingly, in the normal operation mode, the balance of electric current levels can be maintained between a first logic signal and a second logic signal. On the other hand, if the test operation mode selection signal is indicative of the test operation mode, the generator provides a second logic signal at the second electric current level distinctively lower than an electric current level at which a first logic signal is provided. That is, in the test operation mode, if there is a short between a wire that is fed a second logic signal and a wire that is fed a first logic signal, then actual outputs from these wires are at a first logic value. By making use of such a difference in logic value, it is possible to detect the status of short.

The present invention further provides a test circuit, wherein:

(a) the controller receives a first control signal for the switching of a test operation mode and a normal operation mode and a second control signal for the switching of a first electric current mode and a second electric current mode by logic values that are in an inverted relationship, (b) the controller comprises:
(i) a first controller which receives the output from the input means, the first control signal, and the second control signal, thereby the first controller generating a signal of given logic "A" if the output from the input means is a second logic signal and if the first control signal is indicative of the normal operation mode or the second control signal is indicative of the second electric current mode, otherwise the first controller generating a signal of the reverse of logic "A", and
(ii) a second controller which receives the output from the input means, the first control signal, and the second control signal, thereby the second controller generating a signal of the reverse of logic "A" if the output from the input means is a first logic signal and if the first control signal is indicative of the normal operation mode or the second control signal is indicative of the first electric current mode, otherwise the second controller generating a signal of logic "A", and (c) the generator comprises:
(i') a first generation section which receives the output from the input means and generates a logic signal identical in logic value with the output of the input means at a second electric current level, (ii') a second generation section, connected to an output of the first controller, which generates either a current of a first electric current level if the first controller provides a signal of logic "A" or a high impedance if the first control provides a signal of the reverse of logic "A", and (iii') a third generation section, connected to an output of the second controller, which generates either a current of the first electric current level if the second controller provides a signal of the reverse of logic "A" or a high impedance if the second control provides a signal of logic "A".

If the first control signal is indicative of the normal operation mode, the generator then provides a first logic signal and a second logic signal at an electric current level equal to the sum of the first electric current level and the second electric current level for the maintenance of balance therebetween. On the other hand, if the first control signal is indicative of the test operation mode and the second control signal is indicative of the second electric current mode, the generator provides a second logic signal at an electric current level equal to the sum of the first electric current level and the second electric current level and a first logic signal at the second electric current level. Therefore, it is possible to identify the type of fault with a single test pattern since, even when a test signal of the same test pattern is supplied to the generator, the generator provides a first and a second logic signal at different electric current levels depending on the type of fault taking place in wires.

Test pattern generation means for generating test patterns are provided within the integrated circuit and without the output pad circuit. This enables automatic testing for detecting wiring faults within the integrated circuit.

It is preferable that the measurement means comprises:

(a) scan selection means, connected to an output of the generator and to the scan input terminal, for selectively passing either an output signal from the generator or a scan signal from the scan input terminal, and (b) a first flip-flop, connected to an output of the scan selection means, for temporarily holding a signal from the scan selection means and then outputting the same. This cuts down the number of elements required.

It is preferable that the measurement means comprises:

(a) exclusive-OR (XOR) generation means, connected to an output of the input means and to an output of the generator, for generating the XOR of a signal input to the generator and a signal output from the generator, (b) measurement signal selection means, connected to an output of the XOR generation means and to the output of the generator, for selectively passing either an output signal from the XOR generation means or an output signal from the generator, (c) a scan selector, connected to the scan input terminal and to an output of the measurement signal selection means, for selectively passing either a scan signal from the scan input terminal or a signal from the measurement signal selection means, and (d) a first flip-flop, connected to an output of the scan selection means, for temporarily holding a signal from the scan selection means and then outputting the same.

Accordingly, the number of expected-value patterns to be prepared for short fault testing is only one. This results in considerably cutting down the number of test patterns.

It is preferable that the input means comprises:

(a) a second flip-flop, connected to an output of the first flip-flop, for temporarily holding a signal from the first flip-flop, and (b) input signal selection means, connected to an output of the second flip-flop and to the logic input terminal, for selectively passing either a signal from the second flip-flop or an internal logic signal from the logic input terminal.

Such arrangement permits the second flip-flop and the input signal selection means to select either a logic signal generated by the internal logic or a test signal from the scan path depending on the existing mode, and a selected signal is fed to the generator. Therefore, it is possible to perform test operations as well as normal operations with a simple configuration.

BRIEF DESCRIPTION OF THE DRAWINGS

In the drawings:

FIG. 1 is a circuit diagram of a BSCC of a first preferred embodiment of the present invention;

FIG. 2 is a state transition diagram showing changes in control state and changes in control signal during each control mode, in a stuck-at "0"/"1" fault testing by the use of BSCCs of the first preferred embodiment;

FIGS. 8a, 8b, 8c, 8d, 8e, and 8f are diagrams showing changes in control signal, the flow of test data, and the flow of test results during each control mode, in a stuck-at "0"/"1" fault testing by the use of BSCCs of the third preferred embodiment;

FIGS. 26a, 26b, 26c, 26d, 26e, 26f, and 26g is a diagram showing short fault detection in a conventional boundary-scan test circuit.

DETAILED DESCRIPTION OF THE INVENTION By making reference to the accompanying drawings, preferred embodiments of the present invention are now described below.

EXAMPLE 1

Figure 13:
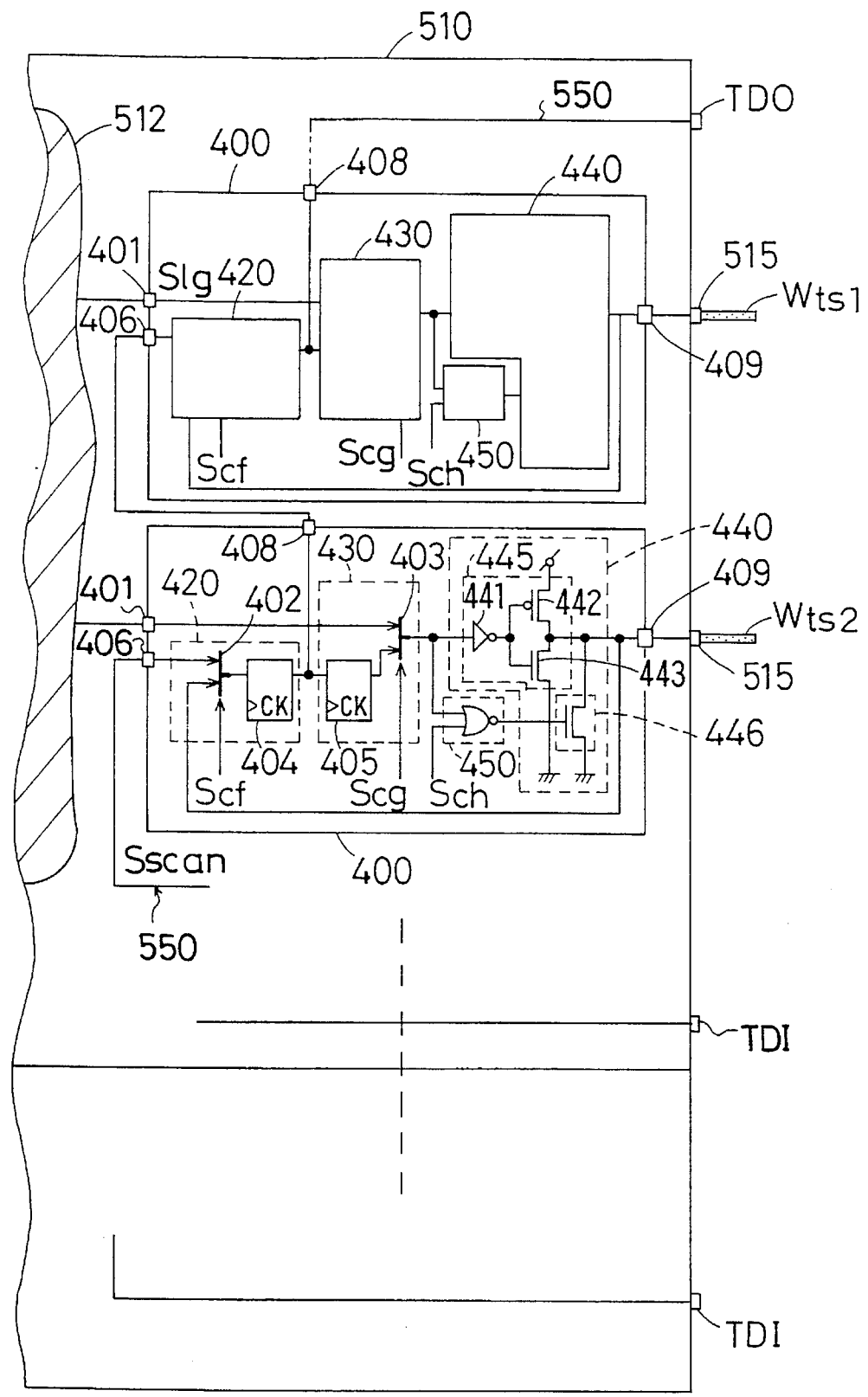
FIG. 13 shows a boundary-scan cell circuit of a sixth embodiment of the present invention.

A first preferred embodiment is explained by reference to FIGS. 1–3. It is to be noted that the layout of components within a boundary scan test circuit of the present invention is basically identical with that of the conventional boundary scan test circuit as shown in FIG. 13 except for the organization of BSCCs.

FIG. 1 shows one BSCC 100a in accordance with the present embodiment. Like the BSCC 100 of FIG. 14, this BSCC 100a comprises the following components: a first selector 102, a second selector 103, a first flip-flop 104, a second flip-flop 105, a buffer 107, a logic signal input terminal 101, a scan signal input terminal 106, a scan signal output terminal 108, a logic signal output terminal 109, and five control signal terminals 110a–110e.

The present embodiment is characterized in that there are provided, between the first selector 102 and the first flip-flop 104, a third selector 111 that serves as a scan signal selector as well as an arithmetic unit 112 that serves as an XOR generator. The arithmetic unit 112 accepts the non-inverted output signal of the first flip-flop 104 serving as an input logic signal storage and the output signal of the first selector 102. The third selector 111 accepts the output signal of the first selector 102 and the output signal of the arithmetic unit 112, thereby selecting one of these two signals according to the logic state of a control signal $S_{cb}$ which is input at the terminal 110b and outputting a signal thus selected. The first flip-flop 104 accepts the output signal of the third selector 111 at its terminal D, and latches it according to the logic state of a clock signal $S_{cd}$ which is input at a terminal CK, and outputs it at its terminal Q. The arithmetic unit 112 accepts the output signal of the first selector 102 as well as the non-inverted output signal of the first flip-flop 104 thereby outputting an XOR sum of these two signals. The second flip-flop 105 accepts the non-inverted output signal of the first flip-flop 104 at its terminal D. According to the logic state of a clock signal $S_{ce}$ which is input at its terminal CK, the second flip-flop 105 latches that signal from the first flip-flop 104 and outputs same at its terminal Q. The second selector 103 is fed the non-inverted output signal of the second flip-flop 105 and a logic signal $S_{lg}$ from the logic signal input terminal 101. Then, according to the logic state of a control signal $S_{cc}$, the second selector 103 selects one of such two signals and outputs a signal thus selected. The second selector 103 gives its output to the buffer 107. Such an output signal of the second selector 103 is delivered to outside the BSCC 100a (for example, to an internal logic) through the logic signal output terminal 109. The scan signal output terminal 108 is connected to the first flip-flop's 104 non-inverting terminal Q. The output of the arithmetic unit 112 is scanned-out to the scan path 150, through the scan signal output terminal 108.

In FIG. 1, the first to third selectors 102, 103, 111 are assigned "0" and "1" at their respective inputs. For example, if the first selector 102 receives $S_{ca}$ control signal carrying thereon a logic value of "0", it selects $S_{lg}$ logic signal from the logic signal input terminal 101 as its input. On the other hand, if it receives $S_{ca}$ control signal carrying thereon a logic value of "1", it selects $S_{scan}$ scan signal from the scan signal input terminal 106 as its input.

Figure 3A:
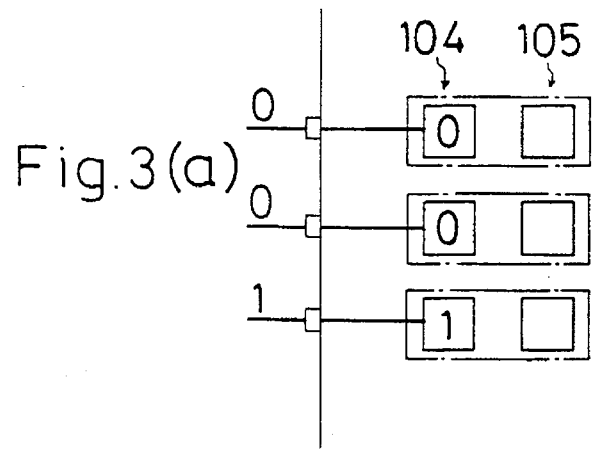
FIGS. 3a, 3b, and 3c are diagrams respectively showing the flows of test results in the first "Capture-DR" state, in the second "Capture-DR" state, and in the "Shift-DR" state in a stuck-at "0"/"1" fault testing by the use of BSCCs of the first preferred embodiment.
Figure 3B:
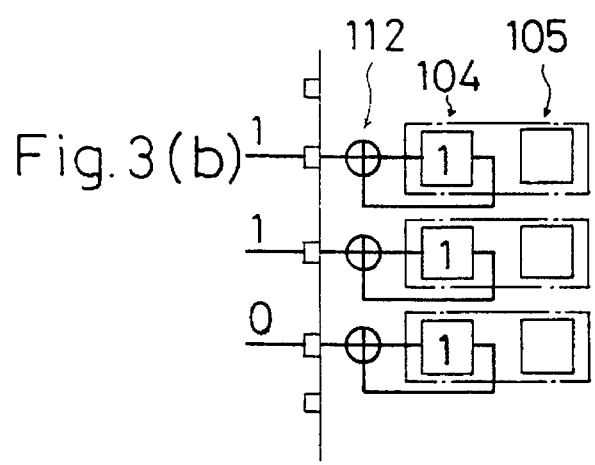
Figure 3C:
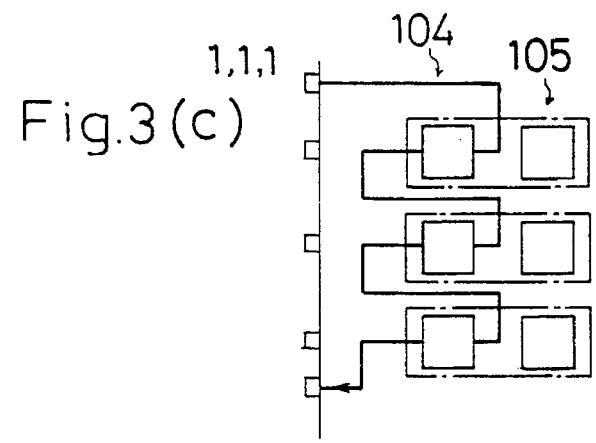

FIGS. 2 and 3a–3c describe how the above-described BSCC 100a operates. Of these figures, FIG. 2 is a TAP controller state transition diagram. FIGS. 3a, 3b, 3c describe how three different BSCCs 100a. arranged on the IC input pins' side, operate.

As shown in FIG. 2, in the first "Capture-DR" state, both $S_{ca}$ and $S_{cb}$ control signals are logic "0's", so that $S_{lg}$ logic signal from the logic signal input terminal 101 is latched by the first flip-flop 104 on the leading edge of $S_{cd}$ clock signal. At this point in time, $S_{cc}$ control signal is a logic "1" and $S_{ce}$ clock signal is a logic "0".

In the second "Capture-Dr" state, $S_{cb}$ control signal changes its logic value from "0" to "1" and thereafter $S_{cd}$ clock signal is applied. As shown in FIG. 3b, a logic value pre-latched by the first flip-flop 104 is XORed with a value of current $S_{lg}$ logic signal from the logic signal input terminal 101, thereafter a newly obtained XOR being latched by the first flip-flop 104. If a value of $S_{lg}$ logic signal latched in the first "Capture-DR" state and a value of $S_{lg}$ logic signal latched in the second "Capture-DR" state are in a logic inversion relationship with each other, the logic value of "1" is always latched by the first flip-flop 104. For example, if these three BSCCs 100a receive three $S_{lg}$ logic signals carrying logic values of "0", "0", and "1", respectively in the first "Capture-DR" state (see FIG. 3a) and if they receive three $S_{lg}$ logic signals carrying logic values of "1", "1", and "0", respectively in the second "Capture-DR" state (see FIG. 3b), this causes each first flip-flop 104 to latch an XOR of "1".

Next, in the "Shift-DR" state, $S_{ca}$ control signal becomes logic "1". Upon receipt of $S_{scan}$ scan signal, the first flip-flop 104 starts functioning as a shift register. In this state, the first flip-flop 104 provides its lastly latched logic value as $S_{scan}$ scan signal (see FIG. 3c).

The application of $S_{ce}$ clock signal in the "Update-DR" state of FIG. 2 causes the second flip-flop 105 to latch the output of the first flip-flop 104. Further, by changing the logic value of $S_{cc}$ control signal to logic "1", this enables the buffer 107 to output the non-inverted output of the second flip-flop 105, regardless of the value of $S_{lg}$ logic signal from the logic signal input terminal 101.

In accordance with the BSCC 100a of the present embodiment, if logic values latched in the first and second "Capture-DR" states match with each other, the first flip-flop 104 latches a logic "0". If they disagree with each other, the first flip-flop 104 latches a logic "1". The present embodiment is able to reduce the number of shift operation cycles necessary for scan-out in boundary scan cell circuits in which continuously logic-inverted signals are lathed. For example, when checking inter-IC wiring for stuck-at "0"/"1" faults, a wire subjected to testing is fed test data and its inversion logic signal, in a BSCC arranged on the input side of an IC. Scanning-out these two different input signals through the wire becomes unnecessary. The presence or absence of stuck-at "0"/"1" faults can be probed by scanning-out only an XOR signal. This reduces the number of shift operation cycles necessary for scan-out, thereby shortening testing time. If the number of wires subjected to testing=N, the number of shift operation cycles required for completing scan-out of the result of the test=N. Accordingly, as the packaging density of ICs increases, boundary scan cell test circuits using the BSCC 100a of the present embodiment become more beneficial. That is, in accordance with the present embodiment, the number of shift operation cycles required can be reduced substantially compared to the prior techniques.

Additionally, the above-described arrangement allows the buffer 107 to provide any logic value. Further, output of a 1-bit XOR as a result of XORing a firstly latched logic value with a secondly latched logic value becomes possible.

It is to be noted that the present invention is not limited to the organization of the BSCC 100a of FIG. 1. For example, the provision of the second flip-flop 105 may be omitted. That the first selector 102 selects one of $S_{scan}$ scan signal and $S_{lg}$ logic signal and applies $S_{scan}$ scan signal or $S_{lg}$ logic signal, whichever is selected, to the arithmetic unit 112 is not a requirement. Input of only $S_{lg}$ logic signal to the first flip-flop 104 may be sufficient, in which case it is possible to route $S_{scan}$ scan signal through a different path to the scan signal output terminal 108 at which it ($S_{scan}$) is output. In the present embodiment, the first flip-flop 104 serving as a temporary storage for input scan signals is employed, but other elements capable of temporarily holding information may be used. However, with the above-described simple circuitry of FIG. 1, it is possible to provide synchronization of input of $S_{lg}$ logic signal, scan-out of XOR signal, and output of $S_{scan}$ scan signal to another BSCC 100a.

EXAMPLE 2

A BSCC 100b of a second preferred embodiment of the present invention is now described below by making reference to FIGS. 4, 5, and 6a to 6c.

Figure 4:
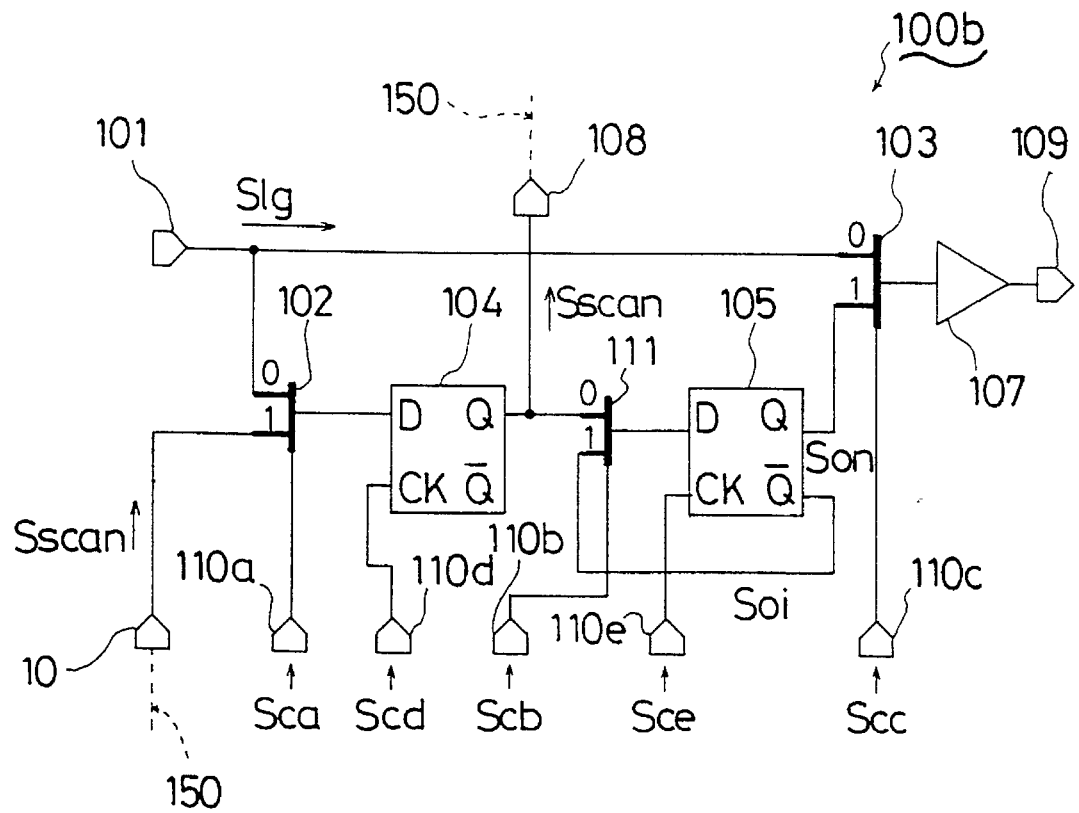
FIG. 4 is a circuit diagram of a BSCC of a second preferred embodiment of the present invention.

FIG. 4 shows the BSCC 100b. As shown in the figure, this BSCC 100b, like the BSCC 100a of the first embodiment, has the first selector 102, second selector 103, third selector 111, first flip-flop 104, second flip-flop 105, buffer 107, logic signal input terminal 101, scan signal input terminal 106, scan signal output terminal 108, logic signal output terminal 109, and control signal terminals 110a–e. In the present embodiment, however, the third selector 111 is provided between the first flip-flop 104 and the second flip-flop 105 and no XOR generators are provided.

The first selector 102 receives $S_{lg}$ logical signal from the logic signal input terminal 101 and $S_{scan}$ scan signal from the scan signal input terminal 106, and selects one of these two input signals according to the logic state of $S_{ca}$ control signal, and outputs a selection (i.e. a signal thus selected). The first flip-flop 104 receives at its terminal D the output of the first selector 102 thereby holding and providing it under control of $S_{cd}$ control signal which is input at the first flip-flop's 104 terminal CK. The third selector 111 accepts the non-inverted output of the first flip-flop 104 and an inverted signal $S_{oi}$ of the second flip-flop 105, and selects one of them according to the logic state of $S_{cb}$ control signal, and outputs a signal thus selected. The second flip-flop 105 receives at its terminal D the output of the third selector 111 and holds it. The second selector 103 is fed a non-inverted signal $S_{on}$ from the second flip-flop 105 and $S_{lg}$ logical signal from the logic signal input terminal 101, and selects one of them according to the logic state of $S_{cc}$ control signal, and outputs a selection. The buffer 107 receives the output of the second selector 103, and outputs it through the logic signal output terminal 109 to outside the BSCC 100b (for example, to $W_{ts}$ of FIG. 13 which is a wire subjected to testing).

Figure 5:
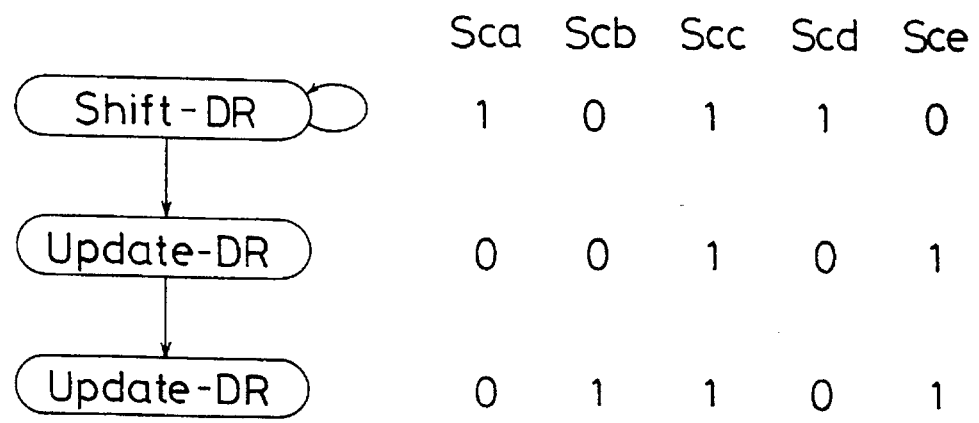
FIG. 5 a state transition diagram showing changes in control state and changes in control signal during each control mode, in a stuck-at "0"/"1" fault testing by the use of BSCCs of the second preferred embodiment.
Figure 6A:
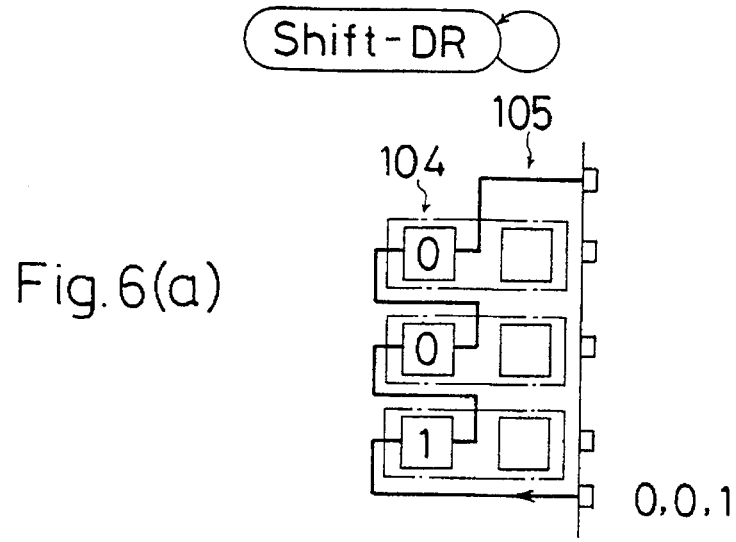
FIGS. 6a, 6b, and 6c are diagrams respectively showing the flows of test results in the "Shift-DR" state, in the first "Update-DR" state, and in the second "Update-DR" state in a stuck-at "0"/"1" fault testing by the use of BSCCs of the second preferred embodiment.
Figure 6B:
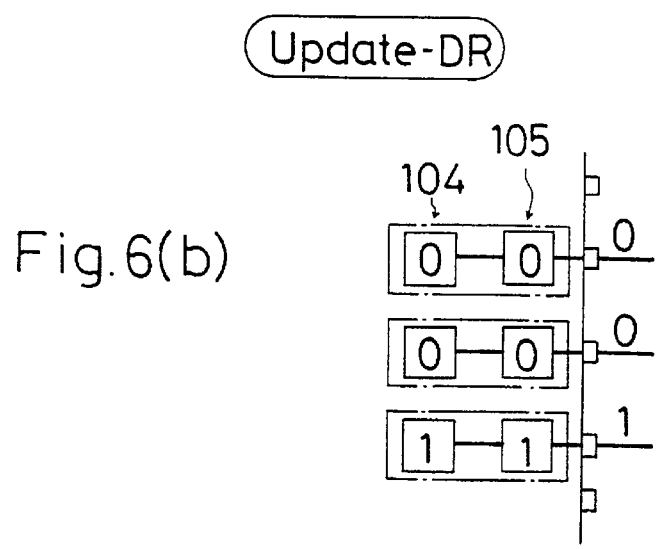
Figure 6C:
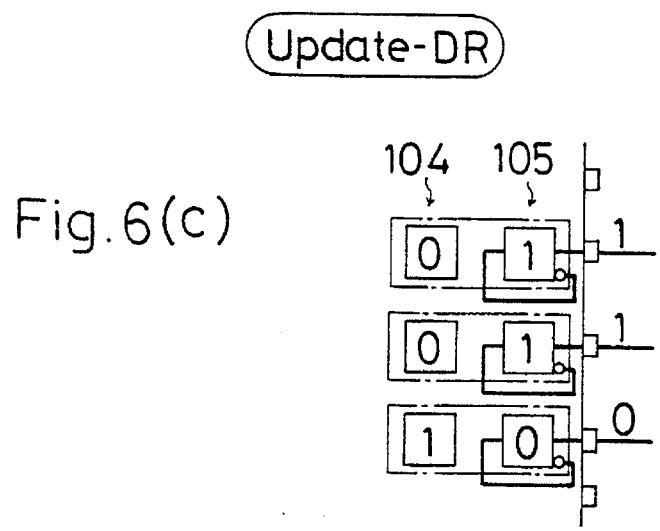

FIGS. 5 and 6a to 6c describe how the above-described BSCC 100b operates. Of these two figures, FIG. 5 is a state transition diagram. FIGS. 6a–6c describe how three different output BSCCs 100b operate.

In the "Shift-DR" state of FIG. 5, $S_{ca}$ control signal becomes logic "1" and, as shown in FIG. 6a, $S_{scan}$ scan signal is applied to the first flip-flop 104. The flip-flop 104 starts functioning as a shift register. Then, a certain logic value is supplied, as $S_{scan}$ scan signal, to each first flip-flop 104. For example, as shown in FIG. 6a, three logic values of "0", "0", and "1" are respectively latched by the three first flip-flops 104.

Next, in the first "Update-DR" state of FIG. 5, $S_{cb}$ control signal becomes logic "0", and, as shown in FIG. 6b, the logic values latched by the first flip-flops 104 are loaded into the corresponding second flip-flops 105. Then, $S_{cc}$ control signal becomes logic "1". This enables the buffer 107 to output the logic value previously applied as $S_{scan}$ scan signal, regardless of $S_{lg}$ logical signal from the logic signal input terminal 101. For instance, as shown in FIG. 6b, "0", "0", and "1" are respectively latched by the first flip-flops 104, and "0", "0", and "1" are respectively latched by the second flip-flops 105.

Next, in the second "Update-DR" state, $S_{cb}$ control signal becomes logic "1". If $S_{ce}$ clock signal is applied to the second flip-flop 105, the inversion value of the lastly latched logic value of the second flip-flop 105 is newly loaded thereinto and is output from the buffer 107. For example, if the three first flip-flops 104 latch "0", "0", and "1", respectively, the corresponding three second flip-flops 105 latch the inversion of what the first flip-flops 104 are latching, or "1", "1", and "0", respectively.

In accordance with the BSCC 100b of the second embodiment, the buffer 107 can immediately output the inversion of a logic value loaded in the first "Update-DR". This will reduce the number of scan-in shift operation cycles in a BSCC in which the buffer 107 outputs a signal which has undergone logic inversion twice in series. For example, when checking inter-IC wiring for stuck-at "0"/"1" faults, scan-in of the inversion of test data becomes unnecessary in a BSCC arranged at output of an IC. This considerably reduces testing time by an amount saved by eliminating the need for scan-in of the inversion of test data. In other words, if the number of wires subjected to testing=N, the number of shift operation cycles required for scan-in of the result of the test=N. Accordingly, as the packaging density of ICs increases, boundary scan cell test circuits by the use of the BSCC 100b of the present embodiment become more beneficial. That is, in accordance with the present embodiment,

17 the number of shift operation cycles can be reduced substantially compared to the prior techniques.

EXAMPLE 3

Referring now to FIGS. 7 and 8a–8f, a third preferred embodiment of the present invention is described, which pertains to a boundary scan test circuit.

Figure 7:
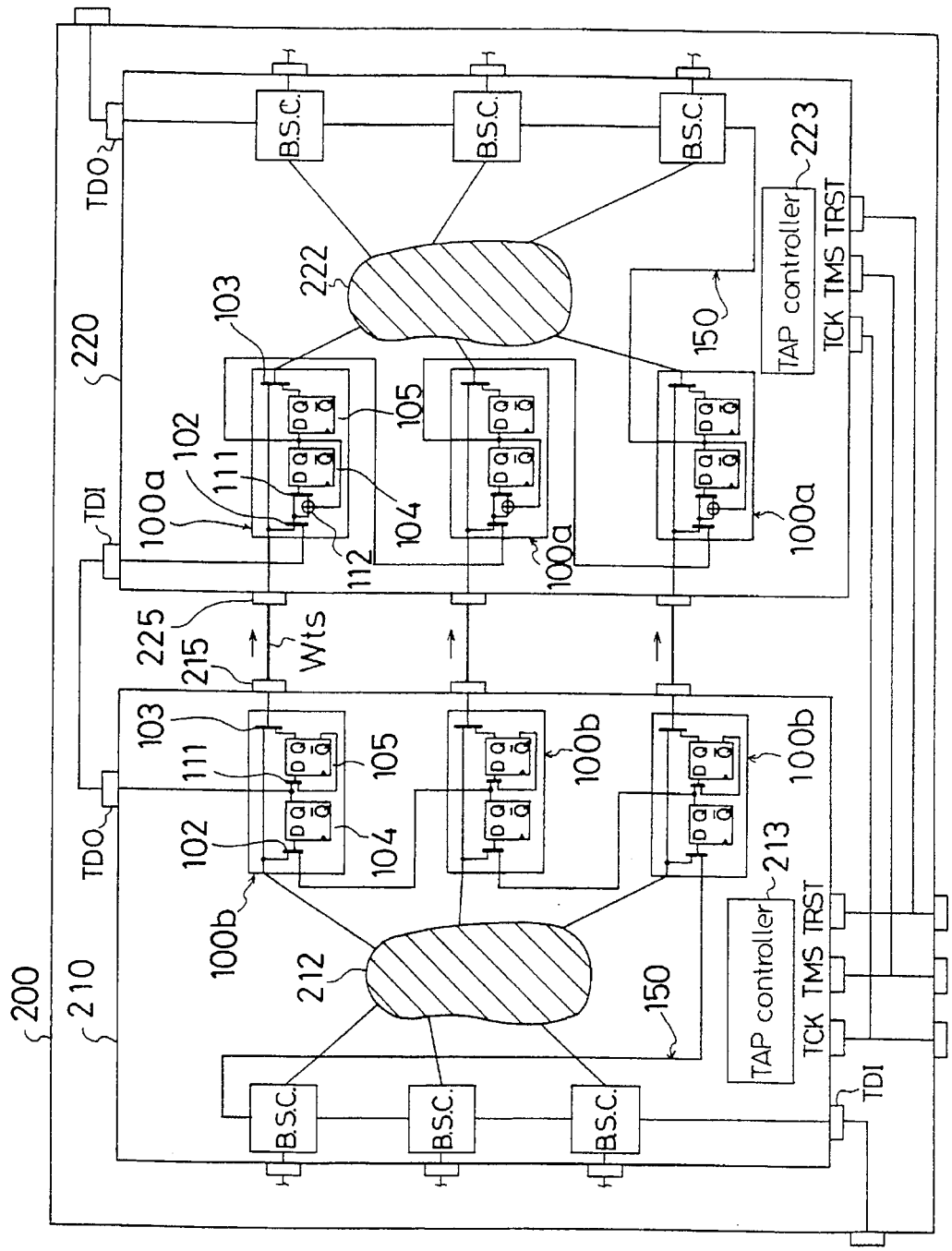
FIG. 7 is a circuit diagram of a BSCC of a third preferred embodiment of the present invention.

FIG. 7 shows the organization of a boundary scan test circuit 200 in which the BSCCs 100a of the first embodiment are provided on the input side (thereafter, these BSCCs 100a are called the input BSCCs) and the BSCCs 100b of the second embodiment are provided on the output side (thereafter, these BSCCs 100b are called the output BSCCs). For convenience sake, only two ICs (i.e. the IC 210 and the IC 220), connection terminals (i.e. the connection terminals 215 and the connection terminals 225), and wires, subjected to testing (i.e. $W_{ts}$), between each connection terminal 215 and each connection terminal 225 are shown.

In FIG. 7, the connection terminal 215 serving as an output pin of the IC 210 is connected to the output BSCC 100b. The output BSCC 100b has the first selector 102, second selector 103, first flip-flop 104, second flip-flop 105, and third selector 111 which accepts the non-inverted output of the first flip-flop 104 as well as the inverted output of the second flip-flop 105, and selects one of them according to the logic state of a control signal, and outputs a selection. On the other hand, the connection terminal 225 serving as an input pin of the IC 220 is connected to the input BSCC 100a. The input BSCC 100a has the first selector 102, second selector 103, first flip-flop 104, second flip-flop 105, arithmetic unit 112 that accepts the output of the first selector 102 as well as the output of the first flip-flop 104 thereby outputting the XOR of these two received outputs, and third selector 111 that accepts the output of the arithmetic unit 112 as well as the output of the first selector 102, selects one of them according to the logic state of a control signal, and outputs a selection. Although not shown in FIG. 7, the TAP controller 213 is connected by a signal wire to the input BSCC 100a and the TAP controller 223 is connected by a signal wire to the output BSCC 100b.

Referring now to FIGS. 8a–8f, both the operation of the input BSCC 100a and the operation of the output BSCC 100b are explained. In the "Shift-DR" state of FIG. 8a, three test data items, say, logic values of "0", "0", "1" are scanned-in to the first flip-flops 104 of the output BSCCs 100b through the scan path 150.

Next, in the "Update-DR" state of FIG. 8b, the test data items of "0", "0", "1" are transferred from the first flip-flops 104 to the second flip-flops 105, thereafter being applied to wires $W_{ts}$ subjected to testing.

In the "Capture-DR" state of FIG. 8c, the test data items of "0", "0", "1" propagate through the wires $W_{ts}$ to the first flip-flops 104 of the input BSCCs 100a and are latched.

Then, in the second "Update-DR" state of FIG. 8d, without newly scanning-in test data items to the second flip-flops 105 of the output BSCCs 100b, the inversion of the previous test data items, that is, "1", "1", "0" are applied to the wires $W_{ts}$ by means of feedback of $S_{oi}$ inverted signal to the input signal selector.

In the second "Capture-DR" state, the first flip-flops 104 of the BSCCs 100a latch the XORs of the previous test results (i.e. "0", "0", "1") and the current test results ("1", "1", "0"), respectively. If each $W_{ts}$ is free from stuck-at "0"/"1" Faults, each first flip-flop 104 should latch a logic "1".

18

Further, in the second "Shift-DR" state of FIG. 8f, "1", "1", and "1" (XOR) latched by the first flip-flops 104 of the BSCCs 100a are scanned-out through the scan path 150. By comparing these XORs ("1", "1", "1") with expected values ("1", "1", "1"), it is possible to check $W_{ts}$ for the presence or absence of stuck-at "0"/"1" faults.

In the present embodiment, no shift operations for scan-in of the inversion of test data are required within the output BSCC 100b when checking for stuck-at "0"/"1" faults. Additionally, scan-out of both a test result with test data and a test result with the inversion of that test data is unnecessary and thus only scan-out of the XOR of these two test results is required. This greatly reduces testing time. In other words, if the number of wires subjected to testing=N, the shift operation necessary for scanning-in test data and for scanning-out a test result is completed for 2N cycles. Therefore, the present embodiment greatly reduces the number of shift operation cycles compared to the prior techniques which require 4N cycles. This means that, as the packaging density of ICs increases, the present embodiment becomes more beneficial.

EXAMPLE 4

A fourth preferred embodiment of the present invention is described, wherein two different BSCCs (i.e. the BSCC 100a and the BSCC 100b) are provided within a single IC 240.

Figure 9:
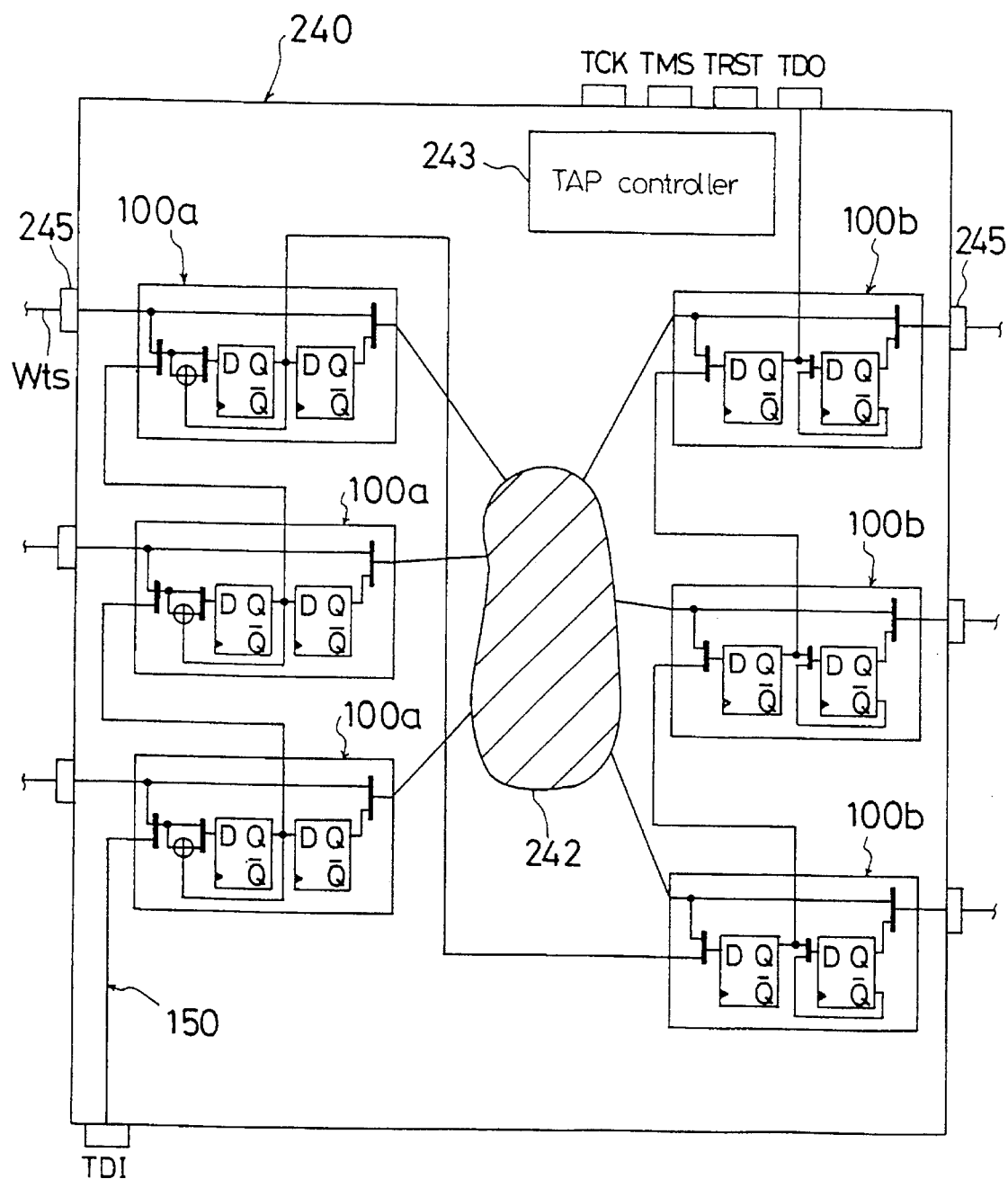
FIG. 9 is a circuit diagram of a BSCC of a fourth preferred embodiment of the present invention.

FIG. 9 is the organization of the IC 240. This IC 240 has an internal logic 242 and a TAP controller 243. The BSCC 100a of the first embodiment is disposed between a connection terminal 245 serving as an input pin and the internal logic 242, whereas the BSCC 100b of the second embodiment is disposed between a connection terminal 245 serving as an output pin and the internal logic 242.

In accordance with the present embodiment, the same effects as the third embodiment can be obtained within a single IC.

EXAMPLE 5

Figure 10:
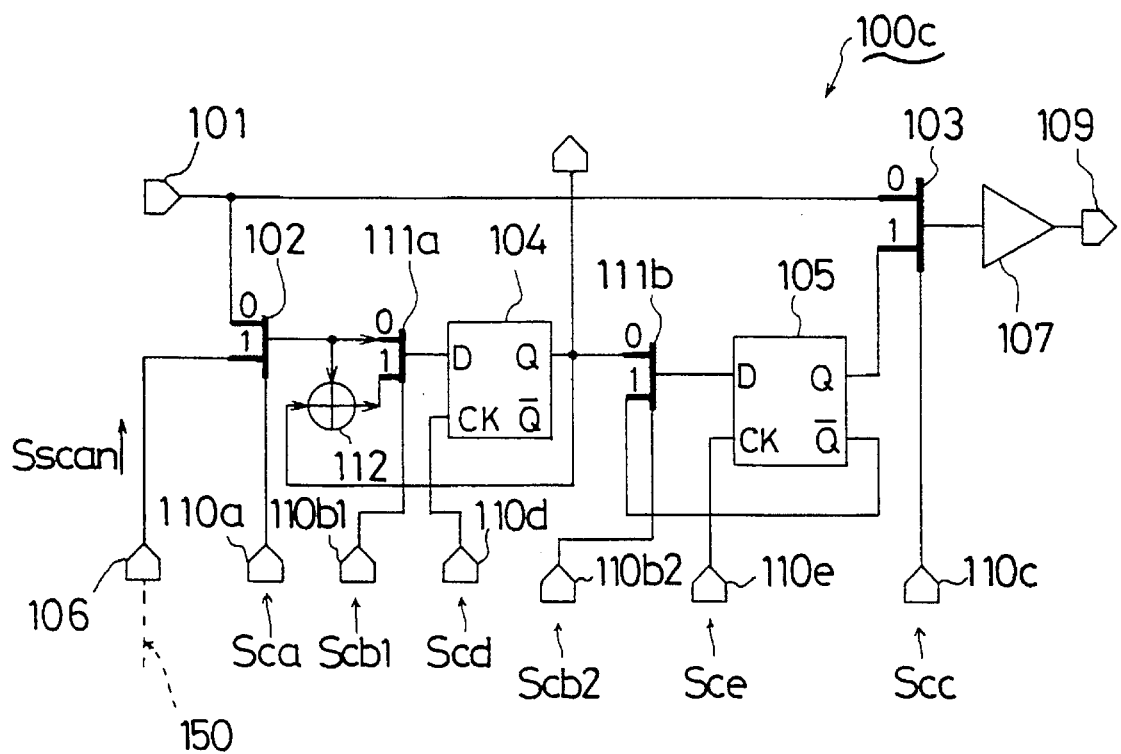
FIG. 10 is a circuit diagram of a BSCC of a fifth preferred embodiment of the present invention.
Figure 11:
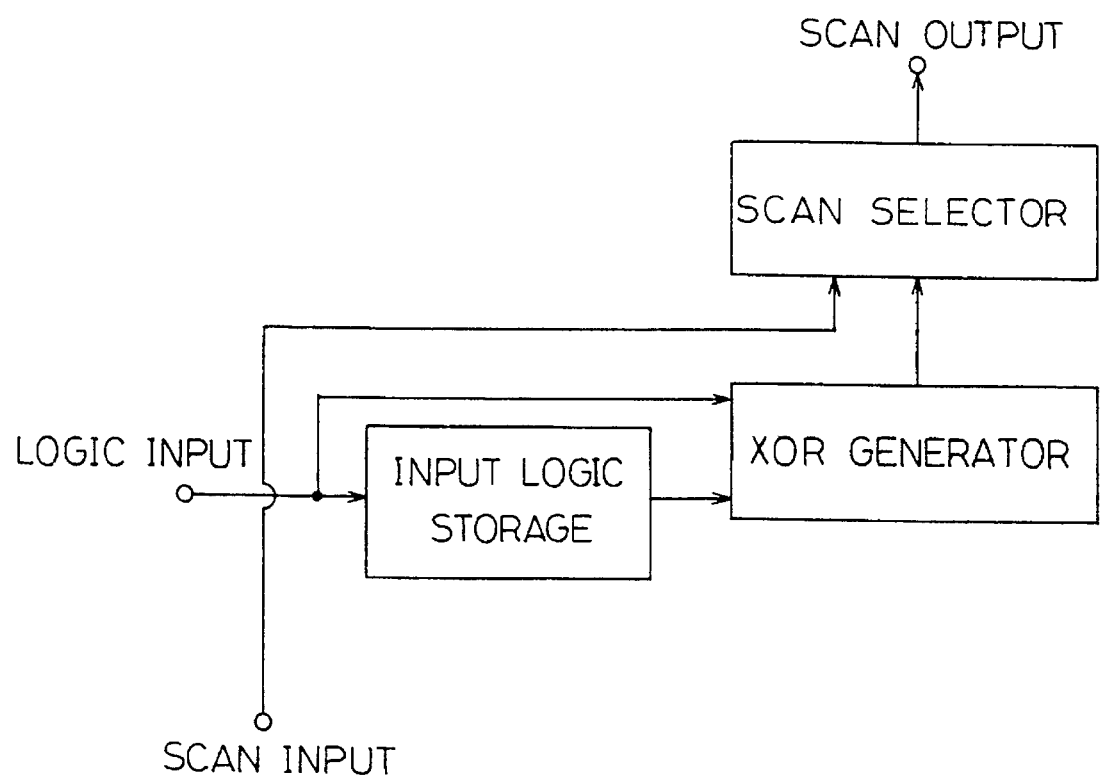
FIG. 11 is a block diagram of a first means.
Figure 12:
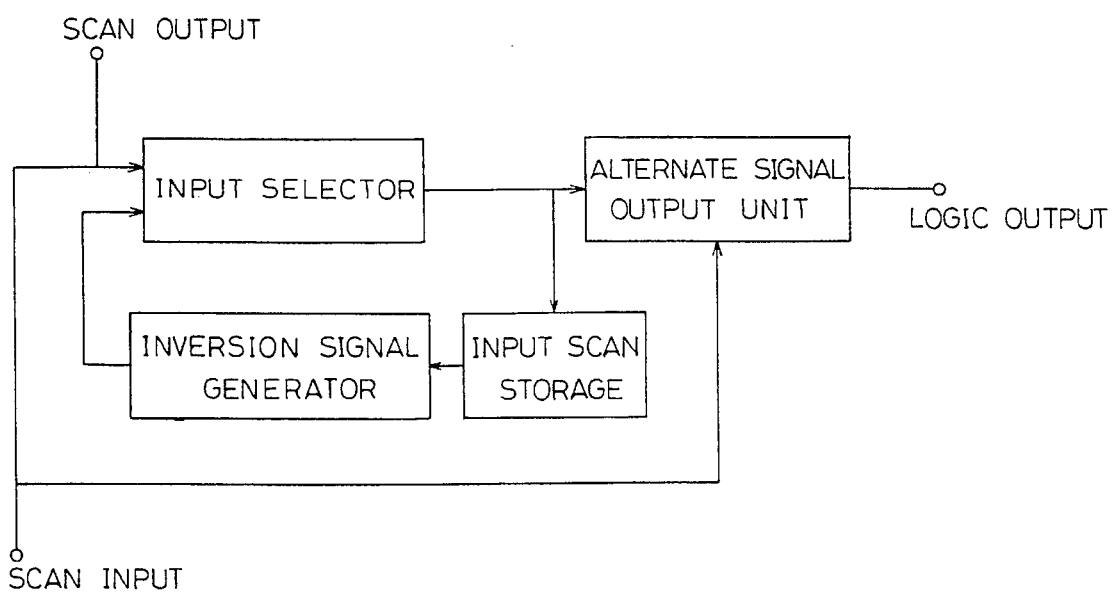
FIG. 12 is a block diagram of a second means.

Referring to FIG. 10, a fifth preferred embodiment of the present invention is explained. This embodiment pertains to a BSCC 100c of a dual function type.

The BSCC 100c, like the BSCC 100a of the first embodiment and the BSCC 100b of the second embodiment, has the logic signal input terminal 101, scan signal input terminal 106, scan signal output terminal 108, logic signal output terminal 109, first selector 102, second selector 103, buffer 107, first flip-flop 104 and second flip-flop 105. In the present embodiment, the BSCC 100c further includes the arithmetic unit 112 of the first embodiment serving as an XOR generator, a selector 111a which is a scan signal selector functioning in the same way as the third selector 111 of the first embodiment, and a selector 111b which is disposed between the first flip-flop 104 and the second flip-flop 105 as an input signal selector functioning in the same way as the third selector 111 of the second embodiment (see FIG. 4). The first selector 102 is fed $S_{ca}$ control signal from the terminal 110a. The selector 111a is fed a control signal $S_{cb1}$ from a terminal 110b1. The first flip-flop 104 is fed $S_{cd}$ clock signal from the terminal 110d. The selector 111b is fed a control signal $S_{cb2}$ from a terminal 110b2. The second flip-flop 105 is fed $S_{ce}$ clock signal from the terminal 110e. The second selector 103 is fed $S_{cc}$ control signal from the terminal 110c. If the BSCC 100c is connected to an IC's input pin, the logic state of $S_{cb2}$ control signal is fixed at logic "0" so that only the output of the first flip-flop 104 can pass through the selector 111b. The switching of $S_{cb1}$ control signal operates the selector 111a, whereby signals to be stored in the second flip-flop 105 and signals to be scanned-out are selected. If the BSCC 100c is connected to an IC's output pin, the logic state of $S_{cb1}$ control signal is fixed at logic "0" so that only the output of the first selector 102 can pass through the selector 111a. The switching of $S_{cb2}$ control signal operates the selector 111b, whereby test data and its inversion are alternately output.

Therefore, the same effects as the first embodiment and as the second embodiment can be obtained by giving the same structure to every BSCC 100c and by changing the function of the BSCCs 100c with respect to their layout location. Production costs are expected to lower by means of mass production.

EXAMPLE 6

Figure 14A:
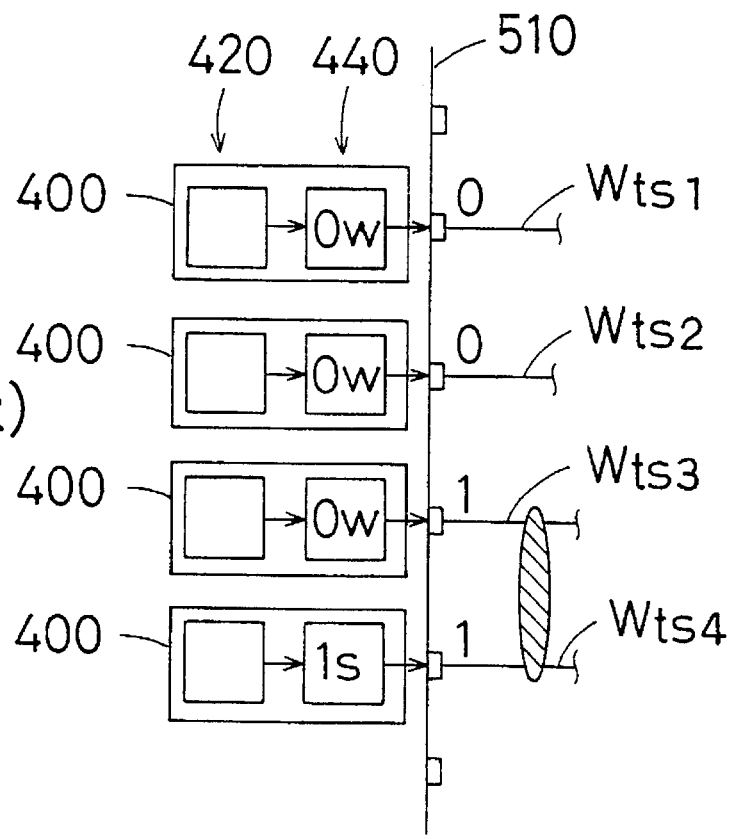
FIGS. 14a and 14b each show the operation of the sixth boundary-scan cell circuit.
Figure 14B:
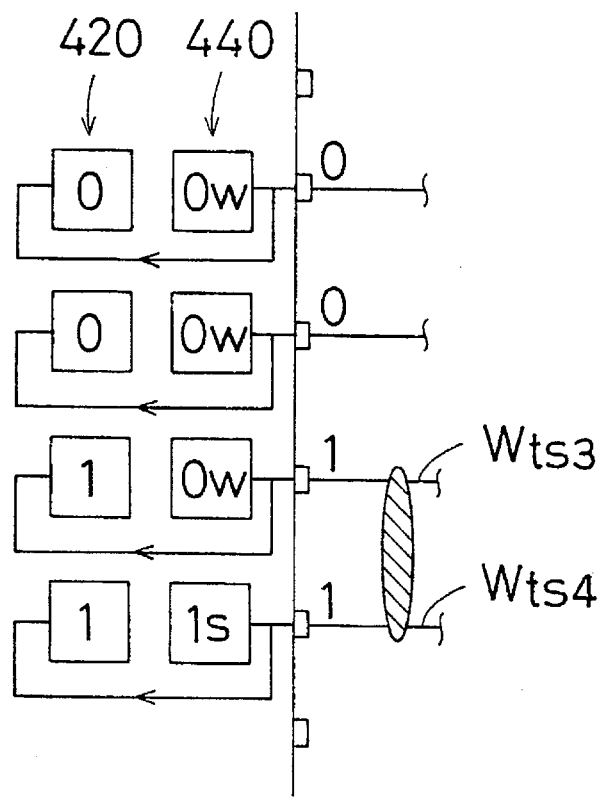

A sixth preferred embodiment of the present invention is described by making reference to FIG. 13 and to FIGS. 14a–14b.

As shown in FIG. 13, the IC 510 of the present embodiment contains therein many output pad circuits 400. Each one of the output pad circuits 400 has a logic input terminal 401, a first flip-flop 404, a second flip-flop 405, a first selector 402, and a second selector 403, and a scan input terminal 406, a scan output terminal 408, and a logic output terminal 409. In the output pad circuit 400, a scan path 550 is formed which establishes a serial connection between the scan output terminal 408 and the scan input terminal 406. $S_{lg}$ (i.e., the internal logic signal) from an internal logic 512 is applied to the output pad circuit 400 by way of the logic input terminal 401.

Further shown in FIG. 13 are a measurement section 420, an input section 430, a generator 440, and a controller 450.

The measurement section 420, formed by the first selector 402 and the first flip-flop 404, performs the function of measuring the logic value of signals from the generator 440. The first flip-flop 404 receives the output from the first selector 402 that is controlled by $S_{cf}$ (i.e., the control signal). The output of the first flip-flop 404 is applied to the second flip-flop 405. The output of the first flip-flop 404 is also applied to outside the output pad circuit 400 in the form of $S_{scan}$ (i.e., the scan signal). Applied to the first selector 402 are $S_{lg}$ from the logic output terminal 409 and $S_{scan}$ from the scan input terminal 406. $S_{scan}$ is a test signal, a measurement result signal, or the similar signal represented by logic 1 (i.e., the first logic) and logic 0 (i.e., the second logic). $S_{scan}$ enters the circuit and is delivered to outside the circuit by way of the scan path 550. The first selector 402 (i.e, the scan selection means) selects $S_{scan}$ if $S_{ou_l}$ (i.e., the control signal)=logic 0. The first selector 402 selects $S_{lg}$ from the logic input terminal 401 if $S_{cf}$=logic 1. In other words, if $S_{cf}$=logic 0, then all the first flip-flops 404 are serially interconnected with one another. As a result, the scan path 550 goes into the continuity state, and each one of the first flip-flops 404 scans in a respective logic value from TDI (i.e., the scan input pin). If $S_{cf}$=logic 1, then the first selector 402 selects the output from the generator 440. The first flip-flop 404 stores the result of the measurement operation, thereafter such a result being applied onto the scan path 550 by way of the scan output terminal 408, and further to outside by way of TDO (i.e., the scan output pin).

The input section 430, formed by the second flip-flop 405 and the second selector 403, takes in $S_{lg}$ from the internal logic 512 and puts out a logic-1 signal or a logic-0 signal to the generator 440. That is, if a test operation mode selection signal $S_{cg}$=logic 0, the second selector 403 then goes into the normal operating state thereby selecting $S_{lg}$ from the logic input terminal 401. If $S_{cg}$=logic 1, on the other hand, the second selector 403 then goes into the testing state thereby selecting a test signal from the second flip-flop 405 and outputting the same. Such a test signal, applied from the second flip-flop 405, is taken in from the scan path 550 by way of the scan input terminal 406 and is temporarily stored by the first flip-flop 404.

The controller 450, comprised of a NOR circuit, receives the output from the second selector 403 and a control signal $S_{ch}$ in step with $S_{cg}$ and calculates the NOR of these two signals. That is, only in such a case where the output of the input section 430=logic 0 and $S_{ch}$=logic 0, the controller 450 gives a logic-1 output (i.e., the logic "A"), otherwise the controller 450 gives a logic-0 output (i.e., the reverse of the logic "A"). Then, as will be described later, the controller 450 controls the generator 440 in order that the generator 450 gives a logic-0 output at a distinctively lower electric current level compared with its logic-1 output.

The generator 440 has a first generation section 445 comprising a PMOS transistor 442 that operates at an electric current level of $I_1$ (i.e., the first electric current level), an NMOS transistor 443 that operates at an electric current level of $I_2$ (i.e., the second electric current level) ($I_1 > I_2$), and an inverter 441. These transistors 442 and 443 have gate terminals that are connected to the output of the inverter 441 and drain terminals that are connected to the logic output terminal 409. The generator 440 further has a second generation section 446 formed by an NMOS transistor that operates at an electric current level of $(I_1-I_2)$, and this NMOS transistor has a gate terminal that is connected to the output of the controller 450 and a drain terminal that is connected to the logic output terminal 409. The input of the inverter 441 is connected to the output of the input section 430.

The generator 440 operates depending on the output of the controller 450 and on the output of the input section 430. The operation of the generator 440 is described below.

The first generation section 445 operates as follows. If the input section 430 gives an output of logic 1 (i.e., the first logic), then the PMOS transistor 442 will go to the ON state and the NMOS transistor 443 to the OFF state. As a result, a logic-1 signal is provided at an electric current level of $I_1$. If the input section gives an output of logic 0, then the PMOS transistor 442 will go to the OFF state and the NMOS transistor 443 to the ON state. As a result, a logic-0 signal is provided at an electric current level of $I_2$.

If the controller 450 gives a logic-1 output (i.e., the logic "A" output), then the NMOS of the second generation section 446 will be on. The second generation section 446 then operates at an electric current level of $(I_1-I_2)$. At this point in time, the controller 450 should receive a logic-0 signal, and therefore the input section 430 should provide logic-0 signals. In other words, the second generation section 446 generates a current signal at an electric current level of $(I_1-I_2)$ only in such a case where the first generation section 445 provides a logic-0 output (i.e., the second logic output). On the other hand, if the controller 450 provides a logic-0 output, this turns the NMOS transistor of the second generation section 446 off so as to generate a high-impedance signal (i.e., the OFF state).

In the testing operation, only the first generation section 445 operates in the generator 440. If a received test signal is logic 1, then a logic-1 signal is applied to the logic output terminal 409 at an electric current level of $I_1$. If a test signal is received at a logic-0 level, then a logic-0 signal is applied to the logic output terminal 409 at a lower electric current level of $I_2$. In the normal operation, the first generation section 445 operates the same way as the above depending on the logic of the input section's 430 output, whereas the second generation section 446 operates only when the logic of $S_{lg}$ is logic 0 and generates a current signal of an electric current level of $(I_1-I_2)$. As a result, the logic output terminal 409 provides a logic-0 output at an electric current level of $I_1$. That is, in the normal operation, the logic output terminal 409 provides a logic-0 output and a logic-1 output at the same electric current level thereby maintaining the electric current level balance.

Referring now to FIGS. 14a and 14b, the checking for short-circuiting by means of the output pad circuit 400 is described. FIGS. 14a and 14b each show the signal status of the output pad circuit 400 when both $S_{ch}$ and $S_{cg}$ are logic 1. FIGS. 14a and 14b respectively correspond to FIGS. 26c an 26d. The output pad circuits 400 put out respective logic signals to respective wires (i.e., $W_{ts1}-W_{ts4}$) at given electric current levels. For the sake of easy understanding, only the measurement section 420 and the generator 440 are shown. The logic of output signals measured by the measurement section 420 is represented by logic 1 or logic 0. By "Ow", what is meant is a logic-0 signal that is supplied at a low electric current level of $I_2$. By "1s", what is meant is a logic-1 signal that is supplied at a high current of $I_1$.

Suppose there occurs a short between $W_{ts3}$ and $W_{ts4}$. If the generator 440 is made to operate, this determines the potential of $W_{ts3}$ and $W_{ts4}$ to be logic 1 (see FIG. 14b) since $I_1>I_2$. Logic values to be measured by the measurement sections 420 are ones as shown in FIG. 14b. The result is scanned-out for comparison with an expected value of 0001. In this way, short faults are detected effectively. Since both a logic-1 signal and a logic-0 signal are supplied at an electric current level of $I_1$ if $S_{ch}$ is logic 0, this will not ill-influence the normal operation. Since the logic of signals from the generator 440 can be measured within the output pad circuit 400, this eliminates the need for providing another measuring means outside the IC 510 thereby lowering the testing cost.

In the present embodiment, either one of the logic-1 current and logic-0 current in the test mode is made smaller as compared with in the normal operation mode. This, however, is not to be considered restrictive. That is, either one of the logic-1 current and logic-0 current in the test mode may be made greater as compared with in the normal operation mode.

EXAMPLE 7

Figure 15:
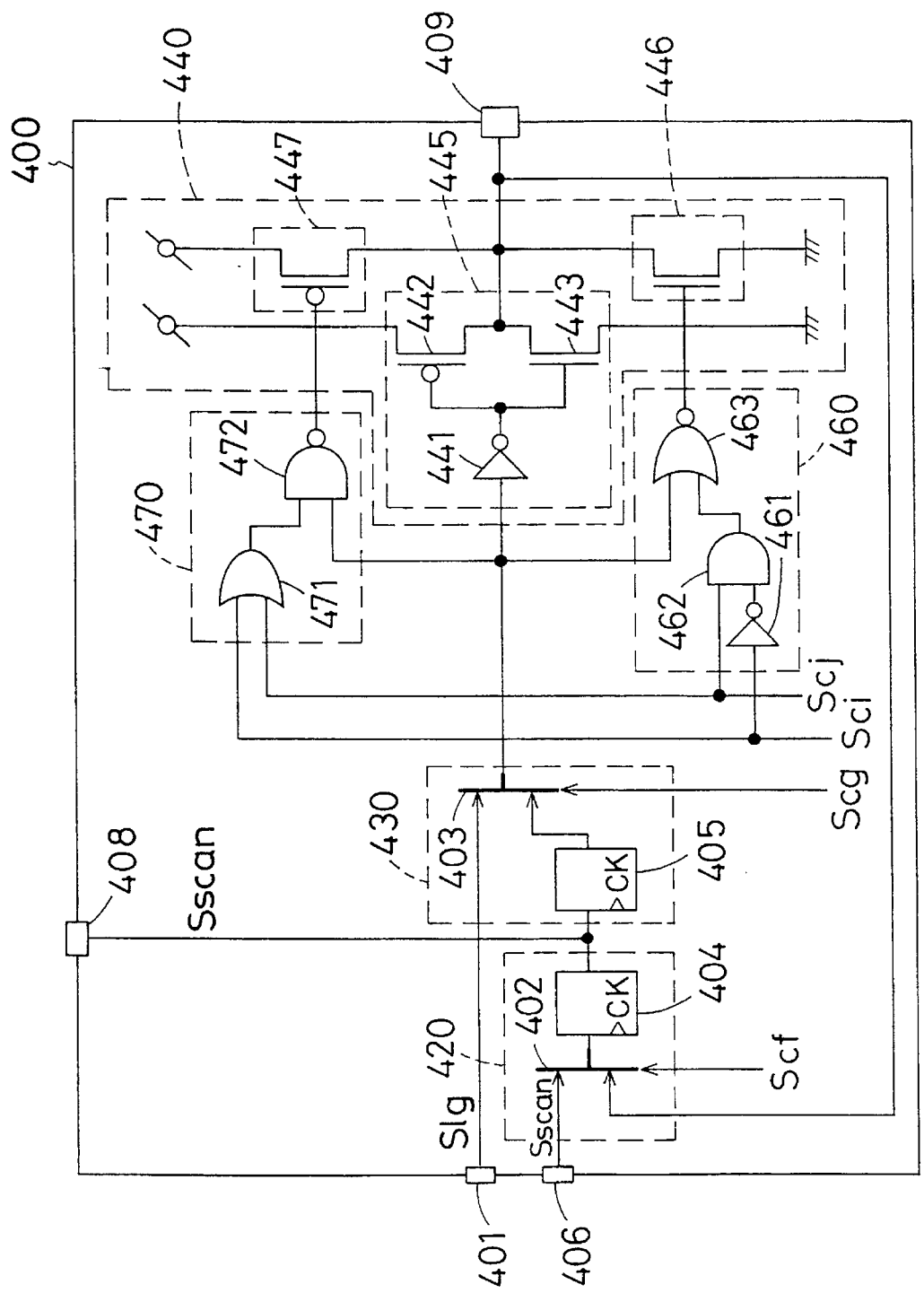
FIG. 15 shows a boundary-scan cell circuit of a seventh embodiment of the present invention.
Figure 16A:
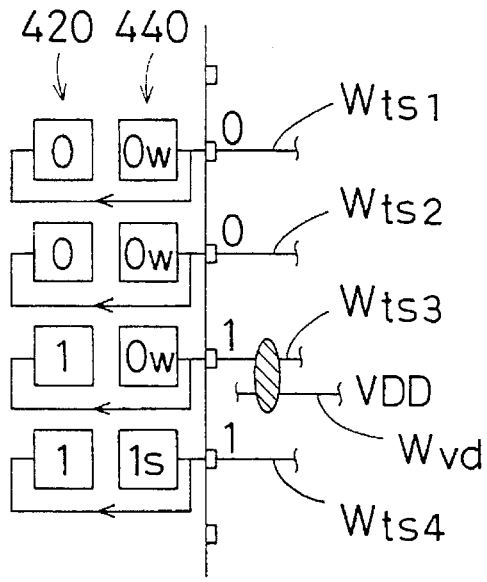
FIGS. 16a–16c each show the operation of the seventh boundary-scan cell circuit.
Figure 16B:
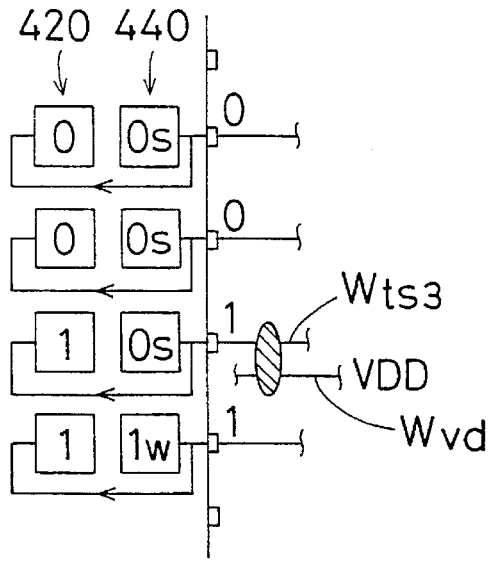
Figure 16C:
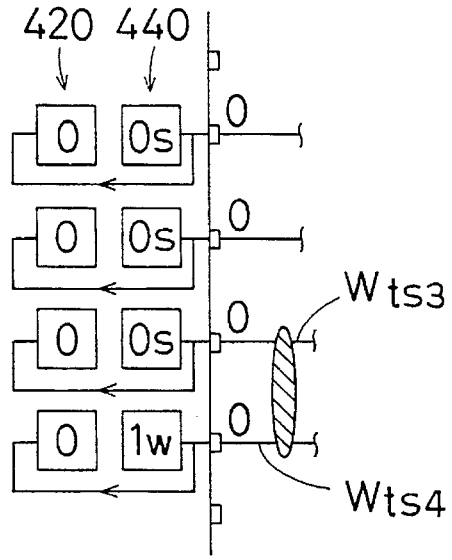

A seventh preferred embodiment of the present invention is described by making reference to FIG. 15 and to FIGS. 16a–16c. As shown in FIG. 15, provided within the output pad circuit 400 are the measurement section 420 and the input section 430.

In the present embodiment, however, a control means is formed by a first controller 460 and a second controller 470. The first controller 460 is formed by an inverter 461, an AND circuit 462, and a NOR circuit 463. The inverter 461 receives a first control signal $S_{ci}$. The AND circuit 462 receives the output from the inverter 461 and a second control signal $S_{cj}$. The NOR circuit 463 receives the output from the input section 430 and the output from the AND circuit 462 and outputs to the gate terminal of the NMOS transistor of the second generation section 446. $S_{ci}$ is the logic reverse of $S_{cg}$. $S_{cj}$ (i.e. the electric current mode switch signal) is used to switch electric current modes so as to identify the electric current mode of wires being tested. Suppose the input section 430 provides a logic-0 signal (i.e., the second logic). In such a case, if $S_{ci}$=logic 1 (i.e., the normal operation mode) or if $S_{cj}$=logic 0 (i.e., the second electric current mode), the NOR circuit 463 takes in 0, 0. As a result, the NOR circuit 463 provides a logic-1 output (i.e., the logic "A" output). In the case of any combination of the input section's 430 output signal, $S_{ci}$, and $S_{cj}$ other than the above-described combination, the first controller 460 provides a logic-0 output that is the reverse of the logic "A".

The second controller 470 is formed by an OR circuit 471 and a NAND circuit 472. The OR circuit 471 receives $S_{ci}$ and $S_{cj}$. The NAND circuit 472 receives the output from the input section 430 and the output from the OR circuit 471 and has an output that is connected to the gate terminal of a PMOS transistor of a third generation section 447. Suppose the input section 430 provides a logic-1 output. The NAND circuit 472 takes in 1, 1 if $S_{ci}$ is logic 1 (i.e., the first logic) or if $S_{cj}$ is logic 0 (i.e., the first electric current mode). Then, the NAND circuit 472 provides a logic-0 output that is the reverse of the logic "A". In the case of any combination of the input section's 430 output signal, $S_{ci}$, and $S_{cj}$ other than the above-described combination, the second controller 470 provides a logic-1 output (i.e., the logic "A" output).

The generator 440 is formed by the first generation section 445 comprising the first inverter 441, the PMOS transistor 442 that operates at an electric current level of $I_2$, and the NMOS transistor 443 that operates at an electric current level of $I_2$; the second generation section 446 comprising an NMOS transistor that operates at an electric current level of $I_1$ ($I_1>I_2$); and the third generation section 447 comprising a PMOS transistor that operates at an electric current level of $I_1$. The PMOS transistor of the third generation section 447 and the NMOS transistor of the second generation section 446 have drain terminals that are connected to the logic output terminal 409.

The first generation section 445 generates a logic-1 signal if the output section 430 provides a logic-1 output. The first generation section 445 generates a logic-0 signal if the output section 430 provides a logic-0 output. These logic-1 and logic-0 signals are generated by the first generation section 445 at the same electric current level (i.e., $I_2$). When the first controller 460 provides a logic-1 output (i.e., the logic "A" output), the second generation section 446 operates to generate a current whose electric current level is $I_1$. When the second controller 470 provides a logic-0 output (i.e., the reverse of the logic "A"), the third generation section 447 operates to generate a current whose electric current level is $I_2$.

The operation of the output pad circuit 400 is explained. If $S_{cg}$=logic 0, the operation goes into the normal operation mode and the second selector 403 selects $S_{lg}$. At this point in time, if $S_{lg}$=logic 1, then both the PMOS transistor forming the third generation section 447 and the PMOS transistor 442 of the first generation section 445 will be on. As a result, the logic output terminal 409 provides a logic-1 output at an electric current level of $(I_1+I_2)$. On the other hand, if $S_{lg}$ is logic 0, then both the NMOS transistor forming the second generation section 446 and the NMOS transistor 443 of the first generation section 445 will be on. As a result, the logic output terminal 409 provides a logic-0 output at an electric current level of $(I_1+I_2)$. In other words, in the normal operation mode, the logic output terminal 409 provides both a logic-1 output and a logic-0 output at the same electric current level (i.e., an electric current level of $(I_1+I_2)$), thereby maintaining balance between them.

When the logic of $S_{cg}$ changes to logic 1, the operation goes into the test operation mode. If $S_{ci}$=logic 0 and $S_{cj}$=logic 1, this keeps the NMOS transistor 446 off; that is, a high-impedance signal is generated. Therefore, the logic output terminal 409 provides a logic-1 output at an electric current level of $(I_1+I_2)$ and a logic-0 output at an electric current level of $I_2$. If $S_{ci}$=logic 0 and $S_{cj}$=logic 0, this keeps the PMOS transistor 447 off and the logic output terminal 409 provides a logic-1 output at an electric current level of $I_2$ and a logic-0 output at an electric current level of $(I_1+I_2)$.

Shown in FIGS. 16a–16c is a detection mode. If (i) a short occurs between $W_{ts3}$ and power supply line $W_{vd}$ to create a stuck-at-1 fault, (ii) a logic-0 output is provided at an electric current level of $I_2$, and (iii) a logic-1 output is provided at an electric current level of $(I_1+I_2)$, then the same measurement result as FIG. 14 is obtained. In order to discriminate between stuck-at fault and short fault, different input patterns are required. Therefore, extra time for scanning-in these new input patterns is needed. In the present embodiment, however, $S_{cj}$ is inverted. This causes current-level inversion between when providing a logic-1 output and when providing a logic-0 output, thereby producing different measurement results between the short fault and the stuck-at fault (see FIGS. 16b and 16c). Because of this, short fault/stuck-at fault separation can be performed using the same test pattern of 0001. It is feasible to reduce the number of test patterns.

EXAMPLE 8

Figure 17:
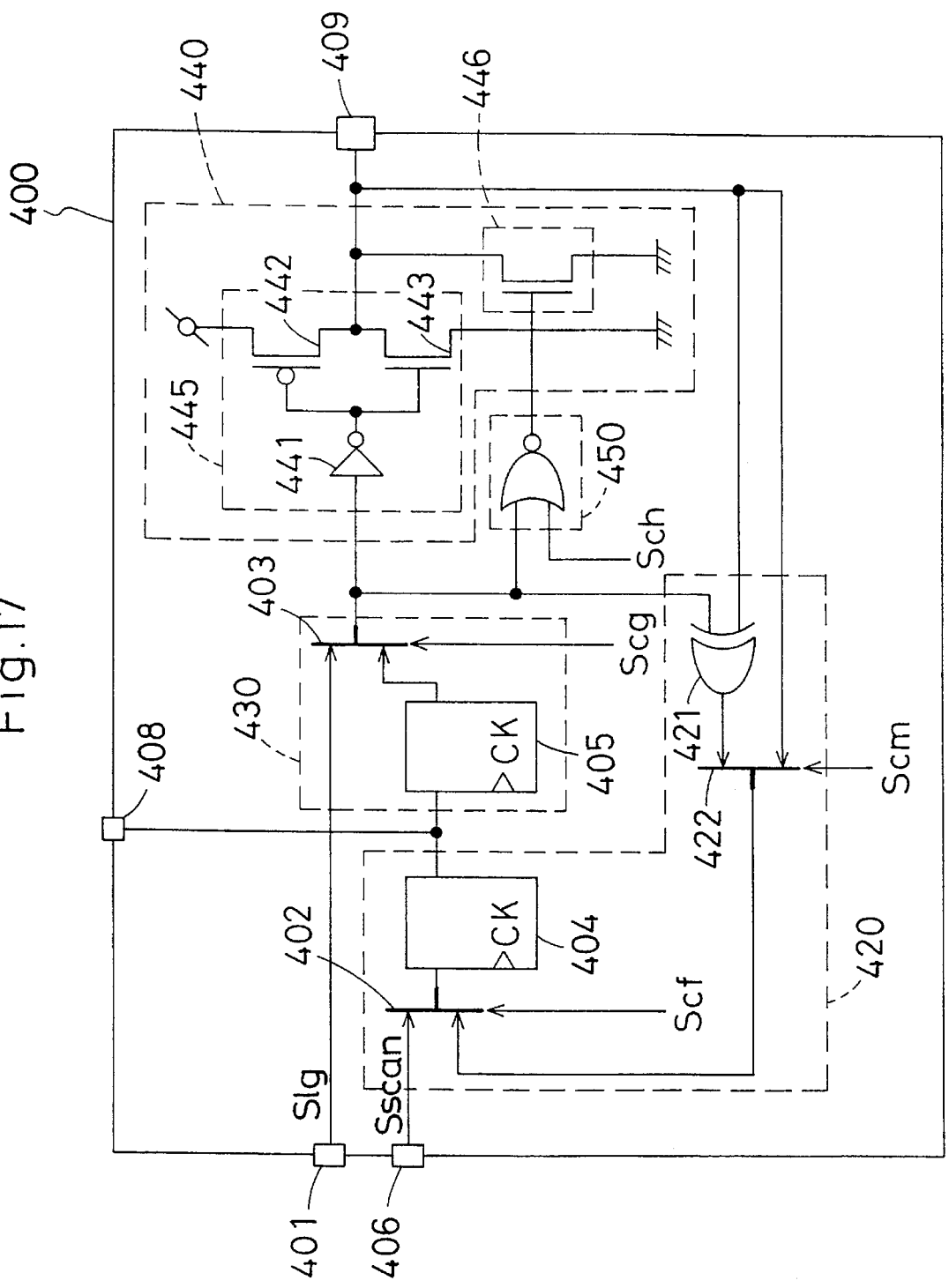
FIG. 17 shows a boundary-scan cell circuit of an eighth embodiment of the present invention.
Figure 18A:
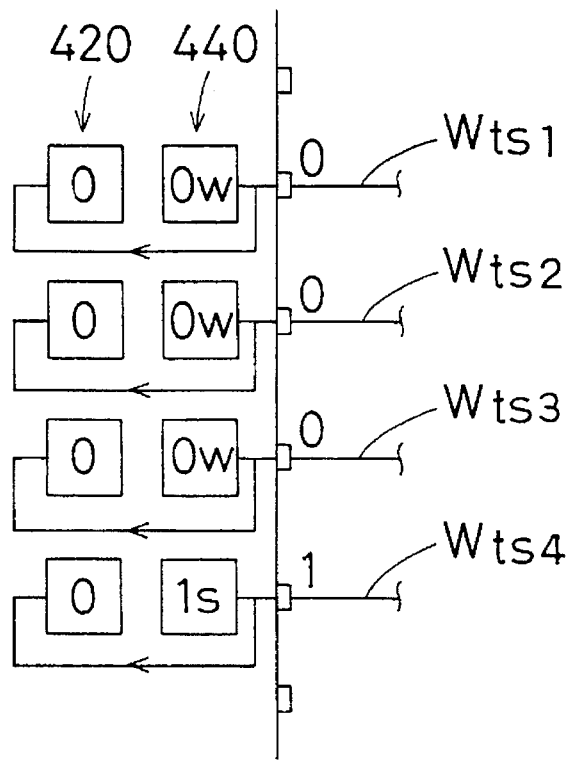
FIGS. 18a and 18b each show the operation of the eighth boundary-scan cell circuit.
Figure 18B:
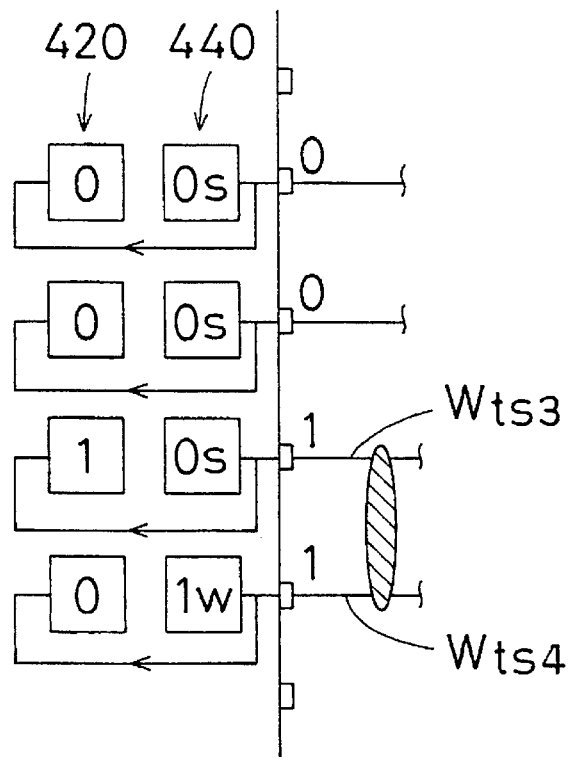

An eighth preferred embodiment of the present invention is described by making reference to FIG. 17 and to FIGS. 18a and 18b. As shown in FIG. 17, the output pad circuit 400 of the present embodiment has the input section 430, the generator 440, and the controller 450. In the present embodiment, the measurement section 420 has an exclusive-OR (XOR) circuit 421 and a selector 422. The XOR circuit 421 receives the output from the input section 430 and the output from the generator 440. The selector 422 receives the output from the XOR circuit 421 and the output from the generator 440 and selectively outputs one of the received outputs according to a control signal $S_{cm}$. The first selector 402 receives the output from the selector 422 and $S_{scan}$. The first flip-flop 404 receives the output from the first selector 402.

The operation of the measurement section 420 is explained by making reference to FIGS. 18a and 18b. If $S_{cm}$=logic 0 and $S_{cj}$=logic 1, the first flip-flop 404 receives the XOR of an input signal to the generator 440 and an output signal from the generator 440. If there occurs no short fault (FIG. 18a), the result of the measurement by the measurement section 420 becomes logic 0, regardless of the logic of signals from the controller 450. If there occurs a short fault between $W_{ts3}$ and $W_{ts4}$ causing a difference in logic between an input signal to the generator 440 and an output signal from the generator 440, the result of the measurement by the measurement section 420 becomes logic 1. Therefore, usually, four test patterns of 0001, 0010, 0100, and 1000 are required in the case of FIG. 6 and four (4) expected value patterns are also needed. Conversely, owing to the output pad circuit 400 of the present embodiment, only one expected value pattern of 0000 is required. The present embodiment is able to reduce the number of expected value patterns required.

EXAMPLE 9

Figure 19:
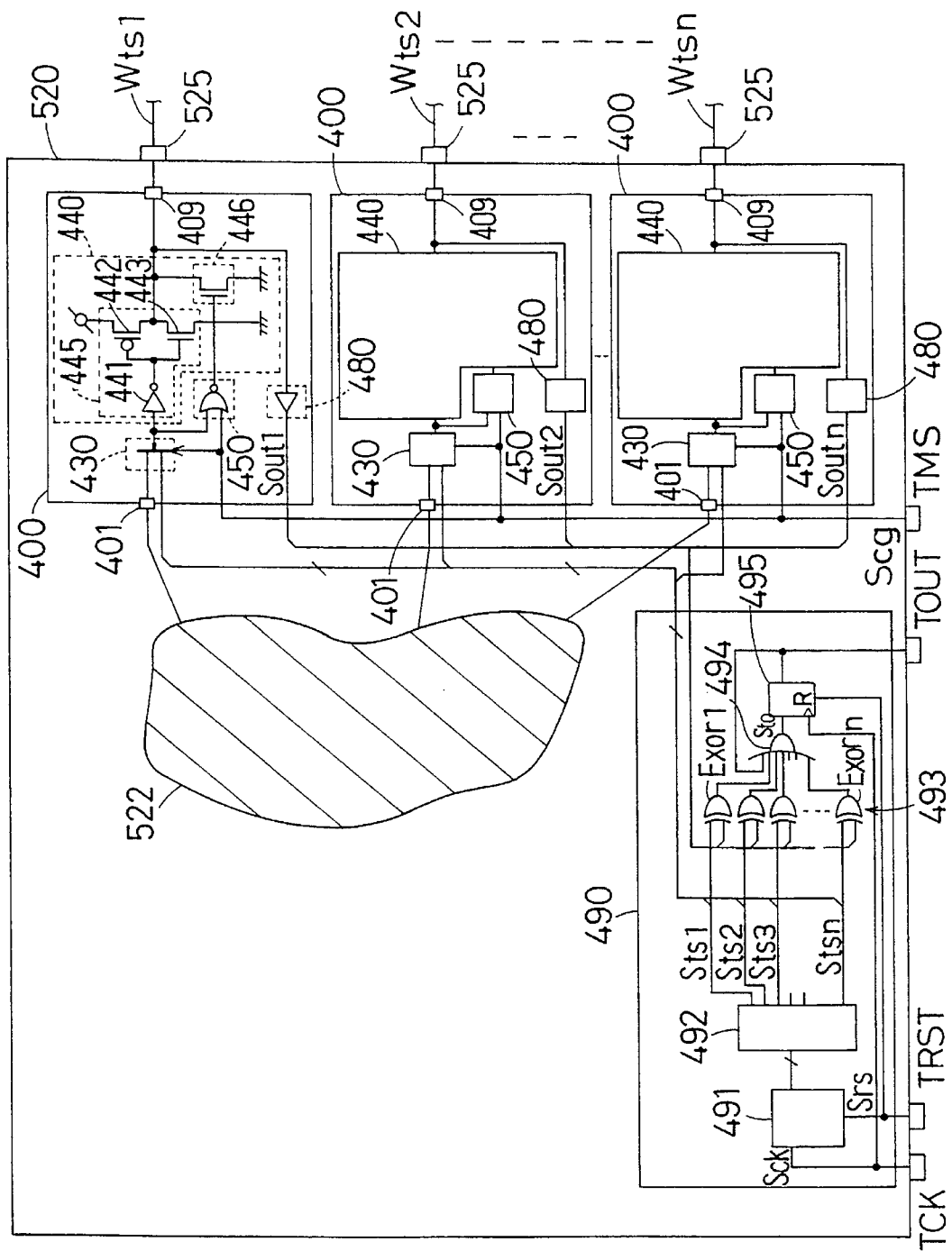
FIG. 19 shows an output pad circuit of a ninth embodiment of the present invention.
Figure 20:
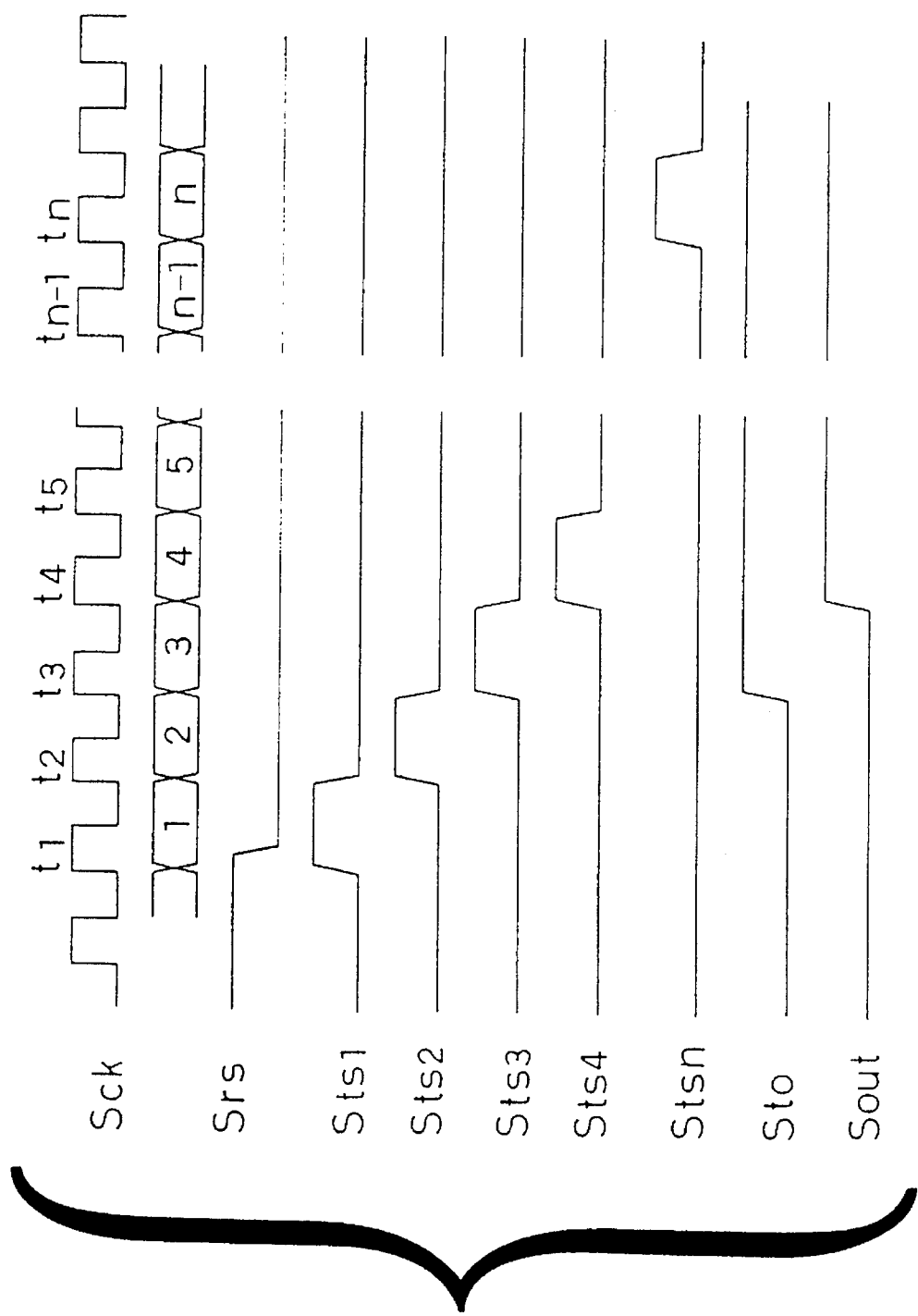
FIG. 20 is an operational timing chart in terms of the ninth embodiment.
Figure 21:
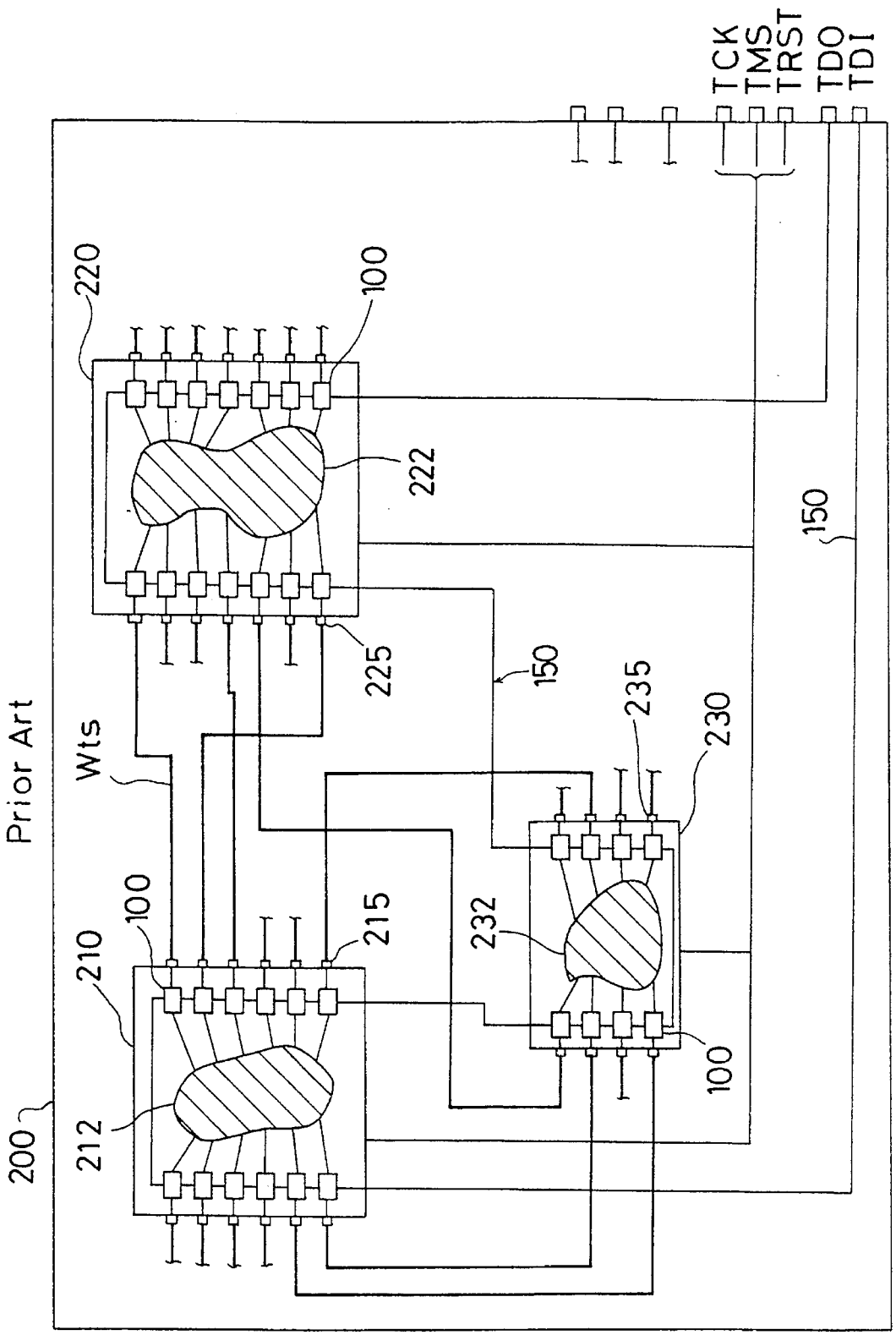
FIG. 21 is a block diagram of a conventional boundary scan test circuit.
Figure 22:
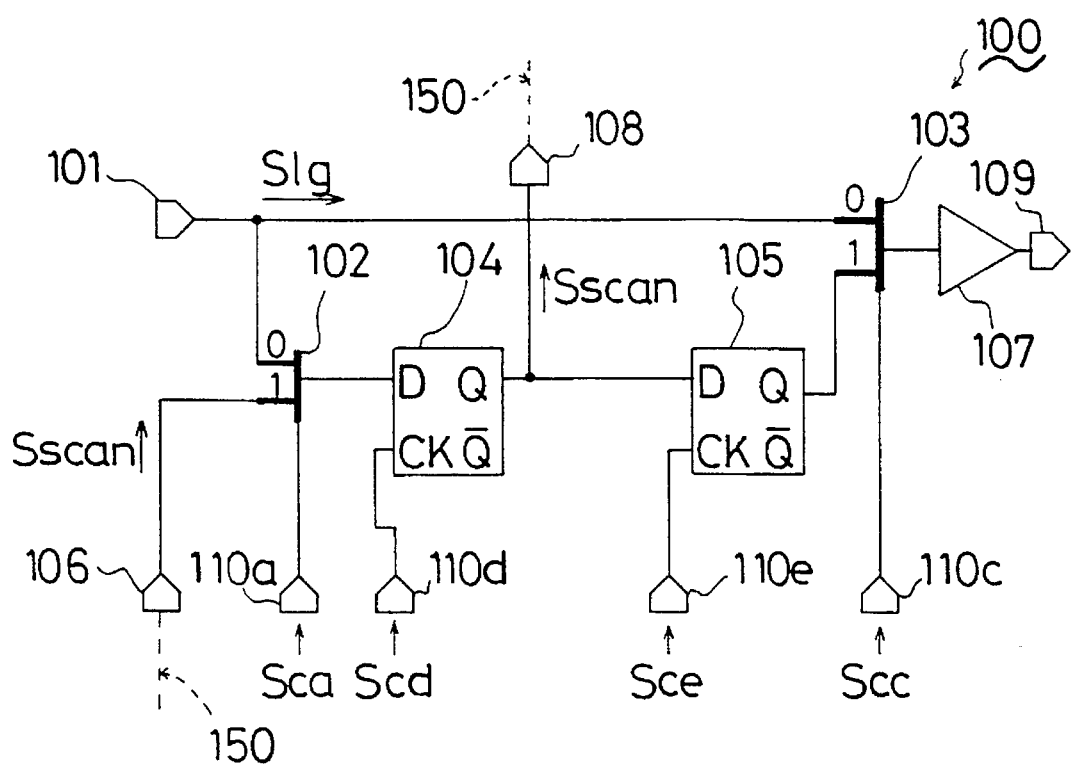
FIG. 22 is a circuit diagram of a conventional BSCC.
Figure 23:
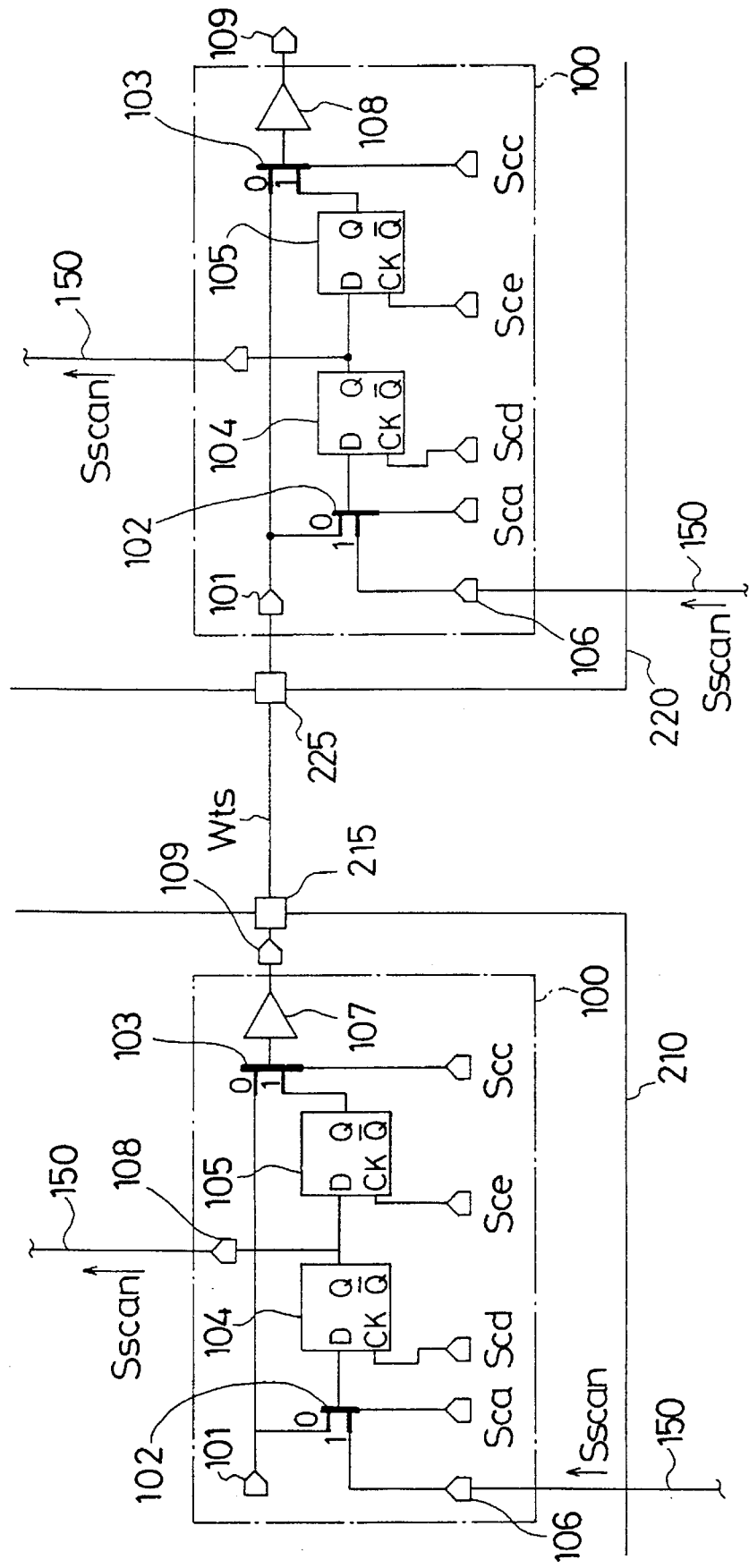
FIG. 23 shows a connection relationship between conventional output and input BSCCs.
Figure 24:
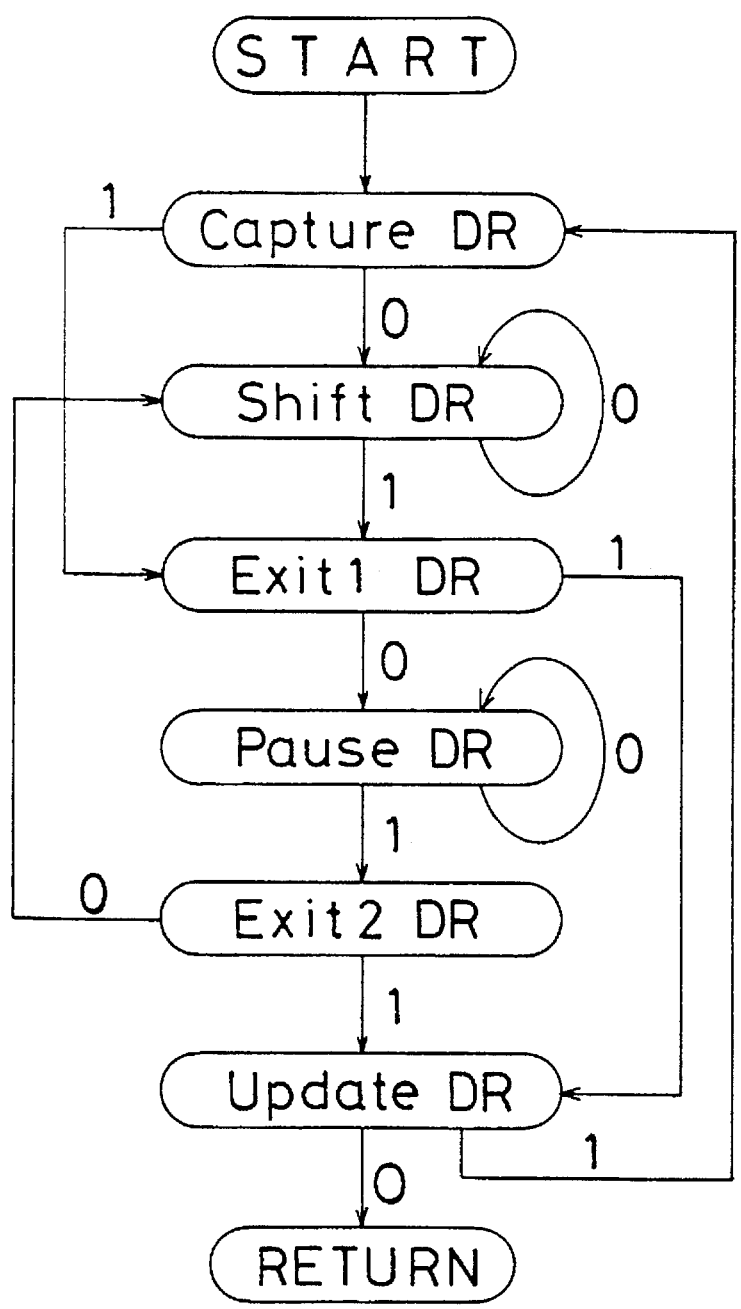
FIG. 24 is a state transition diagram showing changes in control mode in a conventional stuck-at "0"/"1"-Fault testing.
Figure 25:
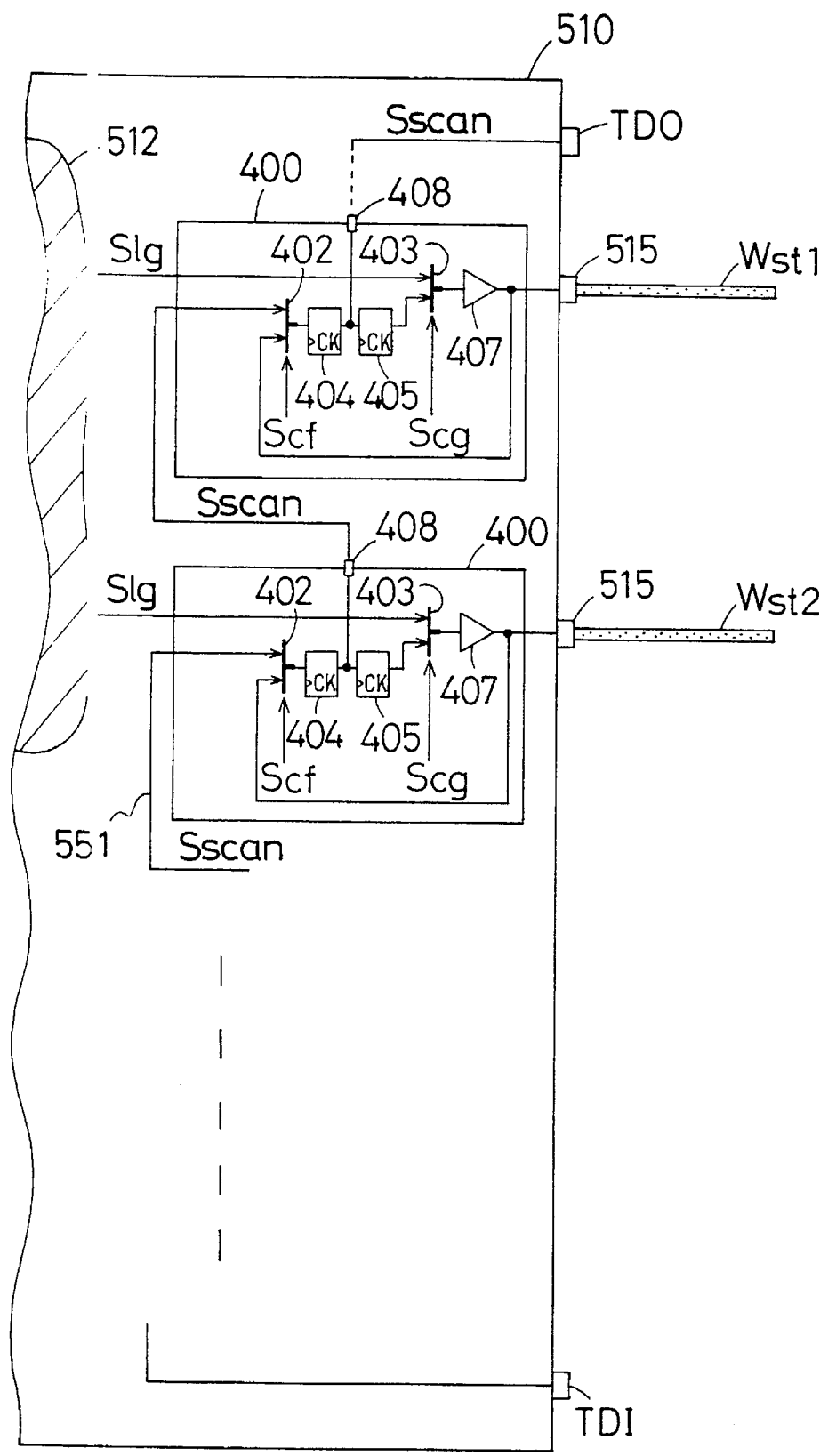
FIG. 25 shows a conventional boundary-scan test circuit.

A ninth preferred embodiment of the present invention is described by making reference to FIGS. 19 and 20. In the foregoing preferred embodiments, the scan path 550 is formed by serially connecting the first flip-flops 404 of the output pad circuits 400. The present invention does not necessarily need the formation of such a scan path.

FIG. 19 shows a BIST (built in self test) integrated circuit 520. This IC 520 contains n output pad circuits 400, an internal logic 522, and a test circuit 490 that automatically generates test data at test time to perform testing. Further shown in FIG. 19 are an input terminal TCK at which a test clock signal $S_{ck}$ is input, an input terminal $T_{RST}$ at which a test reset signal Srs is input, an input terminal $T_{MS}$ at which $S_{cg}$ is input, and an external output terminal $T_{OUT}$ at which a signal is output. Each one of the n output pad circuits 400 is connected to the internal logic 522 via the logic input terminal 401 as well as to a respective wire $W_{ts}$ via the logic output terminal 409 and via an output pin 525. No scan paths that serially connect the output pad circuits 400 are formed.

As shown in FIG. 19, the output pad circuit 400 has the input section 430 formed by a single selector, the generator 440, the controller 450 formed by a NOR circuit that receives $S_{cg}$ and the output from the input section 430, and a buffer 480 that temporarily holds the output from the generator 440 and outputs the same to the test circuit 490. The selector forming the input section 430 receives $S_{lg}$ from the logic input terminal 401 and a test signal from the test circuit 490 and selects either $S_{lg}$ if $S_{cg}$=logic 0 or the test signal if $S_{cg}$=logic 1.

The test circuit 490 has these components: a counter section 491 that receives $S_{ck}$ and $S_{rs}$ so as to measure the period during which the logic of $S_{rs}$ stays logic 0; a decode section 492 that decodes or separates the output from the counter section 491 into test signals $S_{ts1}$–$S_{tsn}$ and outputs these test signals; an exclusive-OR (XOR) generation section 493 which receives $S_{ts1}$–$S_{tsn}$ as well as output signals $S_{out1}$–$S_{outn}$ from the buffers 480 of the n output pad circuits 400 and which is formed by n discrete circuits $E_{xor1}$–$E_{xorn}$ for computing the XOR of $S_{ts}$ and $S_{out}$; and a full-input OR generation section 494 which receives the outputs from the circuits $E_{xor1}$–$E_{xorn}$ of the XOR generation section 493 and the output from a flip-flop 495 and computes the OR of all the inputs. The flip-flop 495 is reset by $S_{rs}$ and its output is applied to the full-input OR generation 494 as well as to outside the IC 520 by way of $T_{OUT}$.

The operation of the output pad circuit 400, along with the operation of the test circuit 490, will be described. If $S_{cg}$ is logic 0, the input section 430 selects $S_{lg}$ from the internal logic 522. If $S_{lg}$ thus selected is logic 1, then the PMOS transistor 442 will be on. As a result, the logic output terminal 409 provides a logic-1 output at an electric current level of $I_1$. If selected $S_{lg}$=logic 0, then both the NMOS transistor 443 of the first generation section 445 and the NMOS transistor forming the second generation section 446 will be on and the logic output terminal 409 provides a logic-0 output at an electric current level of $I_1$. If $S_{cg}$=logic 1, then the input section 430 will select $S_{ts}$ and the NMOS transistor 443 is kept by the controller 450 in the OFF state. Therefore, the logic output terminal 409 provides a logic-1 output at an electric current level of $I_1$ and a logic-0 output at a lower electric current level (i.e., at $I_2$).

The testing of wiring for the occurrence of short-circuiting in the IC 520 is described by making reference to FIG. 20. Suppose there is a short between $W_{ts3}$ and $W_{ts4}$. When the logic of $S_{cg}$ is made to be logic 1, this allows the operation to enter the test operation mode. The logic of $S_{rs}$ is made to be logic 1. As a result, the counter section 491 and the flip-flop 495 are reset to their original setting. Then, the counter section 491 provides a logic-0 output, and of all the output signals from the decode section 492 only $S_{ts1}$ is logic 1 and the remaining test signals (i.e., $S_{ts2}$–$S_{tsn}$) are logic 0 (TIMING $t_1$ of the figure). At this point in time, $S_{cg}$ is logic 1 so that a logic-1 signal is applied to $W_{ts1}$ at an electric current level of $I_1$. On the other hand, logic-0 signals are applied to $W_{ts2}$–$W_{tsn}$ at an electric current level of $I_2$ ($I_2 < I_1$).

Thereafter, $W_{ts2}, W_{ts3}, \ldots, W_{tsn}$ sequentially give logic-1 outputs (TIMING $t_2$–$t_n$). As long as there occurs no short circuiting between a wire that provides a logic-1 signal and a wire that provides a logic-0 signal, an output $S_{outi}$ from the buffer 480 is equal to $S_{tsi}$ (i.e., the test signal) of the output pad circuit 400. Therefore, a corresponding discrete circuit $E_{xori}$ provides a logic-0 output, the full-input OR generation section 494 provides a logic-0 output, and the flip-flop 490 still provides a logic-0 output. At TIMING $t_3$, however, a logic-0 output is provided from $W_{ts3}$ at an electric current level of $I_1$ while a logic-0 output is provided from $W_{ts4}$ at an electric current level of $I_2$. Since, as mentioned above, there is short-circuiting between $W_{ts3}$ and $W_{ts4}$, their potential is logic 1 that is provided at a higher electric current level. Accordingly, the buffer 480 provides a logic-1 output, the discrete circuit $W_{xor4}$ correspondingly provides a logic-1 output, and the full-input OR generation section 494 also provides a logic-1 output. As a result, $S_{out}$ from $T_{OUT}$ will be logic 1 at the next timing (i.e., TIMING $T_4$). Thereafter, such a logic value is maintained until a reset occurs by $S_{ck}$.

If $S_{ck}$ for n clock signals is input and the logic of $S_{OUT}$ from $T_{OUT}$ is measured, this makes it possible to automatically check for the presence or absence of short faults.

If $S_{cg}$ is logic 0, $S_{lg}$ from the internal logic 522 is selected in the input section 430. The controller 450 controls the generator 440 to make it (the generator 440) provide both an inverted logic-1 output and a logic-0 output at the same electric current level. This will not ill-influence the normal operation. Even when the balance of electric current levels is upset causing short faults at detection time, the result of the measurement operation can be kept correct and the efficiency thereof is improved with test patterns in a smaller number. If a test pattern generation means and a compare means for making a comparison between a test pattern and a test result are incorporated into the IC 520, this eliminates the need for additionally providing a separate measuring means outside the IC 510. This not only lowers the detection cost but also reduces the detecting time.

For automatic generation of test patterns, built-in RAM/ROM or devices such as LSFR based on shift registers may be used instead of employing the counter section 491 and the decode section 492. Additionally, a means for detecting measurement results may have a structure capable of compressing the results. Further, different BIST systems known in the art may be useful.

In the present invention, the logic 1 is the first logic and the logic 0 is the second logic, which is not to be considered restrictive, that is to say, the logic 0 may act as a first logic and the logic 1 as a second logic.

The invention claimed is:

1. An output pad circuit comprising:
   (a) input means for receiving a logic signal of first logic or a logic signal of second logic from the outside of said output pad circuit,
   (b) a variable signal-current-level generator, connected to an output of said input means, for generating a logic signal identical in logic value with said logic signal from said input means, and
   (c) a controller for exerting control in order that said generator generates a first logic signal and a second logic signal at different electric current levels in a test mode and generates a first logic signal and a second logic signal at the same current level in a normal mode.

2. An output pad circuit as in claim 1 further including measurement means for measuring the logic value of said logic signal from said generator.

3. A test circuit for the testing of a wire connected between integrated circuits, said test circuit incorporated in an integrated circuit, comprising:
   (a) an internal logic circuit for generating either an internal logic signal of first logic or an internal logic signal of second logic,
   (b) test signal generation means for generating either a test signal of first logic or a test signal of second logic,
   (c) a plurality of output pad circuits connected to an output of said internal logic circuit as well as to an output of said test signal generation means, for generating given logic signals,
   (d) an output pin, connected to a wire connected between integrated circuits as well as to an output pad circuit, for applying said given logic signals generated by said output pad circuit to said wire, and
   (e) measurement means for measuring the logic value of said given logic signals from said output pad circuit,
   wherein said each output pad circuit comprises:
   (i) a logic input terminal connected to said internal logic circuit,
   (ii) input means for alternatively inputting an internal logic signal and a test signal according to a mode-switch control signal for switching between a test operation mode and a normal operation mode and outputting the same,
   (iii) a variable signal-current-level generator, connected to an output of said input means, for generating a logic signal identical in logic value with said logic signal outputted from said input means,
   (iv) a controller for exerting control in order that said variable signal-current-level generator generates a first logic signal and a second logic signal at different electric current levels in a test mode and generates a first logic signal and a second logic signal at the same current level in a normal mode, and
   (v) a logic output terminal connected to an output of said variable signal-current-level generator as well as to said output pin.

4. A test circuit as in claim 3 wherein:
   (a) said test circuit is a boundary-scan test circuit,
   (b) said each output pad circuit comprises:
   (i) a scan input terminal connected to each output pad circuit at which a scan signal is input, and
   (ii) a scan output terminal connected to each output pad circuit at which said scan signal is output, and
   (c) a scan path is formed between each said scan input terminal and said scan output terminal for sequentially connecting said plural output pad circuits in series.

5. A test circuit as in claim 4, wherein said measurement means comprises:
   (a) scan selection means, connected to an output of said variable signal-current-level generator and to said scan input terminal, for selectively passing either an output signal from said generator or a scan signal from said scan input terminal, and (b) a first flip-flop, connected to an output of said scan selection means, for temporarily holding a signal from said scan selection means and then outputting the same to said scan output terminal.

6. A test circuit as in claim 4, wherein said measurement means comprises:

(a) exclusive-OR (XOR) generation means, connected to an output of said input means and to an output of said variable signal-current-level generator, for generating the XOR of a signal input to said generator and a signal output from said generator, (b) measurement signal selection means, connected to an output of said XOR generation means and to the output of said generator, for selectively passing either an output signal from said XOR generation means or an output signal from said generator, (c) a scan selector, connected to said scan input terminal and to an output of said measurement signal selection means, for selectively passing either a scan signal from said scan input terminal or a signal from said measurement signal selection means, and (d) a first flip-flop, connected to an output of said scan selection means, for temporarily holding a signal from said scan selection means and then outputting the same to said scan output terminal.

7. A test circuit as in either claim 5 or claim 6, wherein said input means comprises:

(a) a second flip-flop, connected to an output of said first flip-flop, for temporarily holding a signal from said first flip-flop, and (b) input signal selection means, connected to an output of said second flip-flop and to said logic input terminal, for selectively passing either a signal from said second flip-flop or an internal logic signal from said logic input terminal to said controller and said variable signal-current-level generator.

8. A test circuit as in claim 3, wherein:

(a) a control signal to said controller is a test operation mode selection signal for the switching of a test operation mode and a normal operation mode of said output pad circuit, (b) said controller receives the output from said input means and said test operation mode selection signal, thereby said controller generating a signal of given logic "A" if the output from said input means is a second logic signal and said test operation mode selection signal is indicative of a normal operation mode, otherwise said controller generating a signal of the reverse of logic "A," and (c) said generator comprises:

(i) a first generation section, connected to an output of said input means, for generating either a first logic signal at a first electric current level if said input means provides a first logic signal or a second logic signal at a second electric current level distinctively lower than said first electric current level if said input means provides a second logic signal, and (ii) a second generation section, connected to an output of said controller, for generating either an electric current equivalent to a difference between said first electric current level and said second electric current level if said controller provides a signal of logic "A" or a high impedance if said controller provides a signal of the reverse of logic "A."

9. A test circuit as in claim 3, wherein, (a) said controller receives a first control signal for the switching of a test operation mode and a normal operation mode and a second control signal for the switching of a first electric current mode and a second electric current mode by logic values that are in an inverted relationship, (b) said controller comprises:

(i) a first controller which receives the output from said input means, said first control signal, and said second control signal, thereby said first controller generating a signal of given logic "A" if the output from said input means is a second logic signal and if said first control signal is indicative of the normal operation mode or said second control signal is indicative of the second electric current mode, otherwise said first controller generating a signal of the reverse of logic "A," and (ii) a second controller which receives the output from said input means, said first control signal, and said second control signal, thereby said second controller generating a signal of the reverse of logic "A" if the output from said input means is a first logic signal and if said first control signal is indicative of the normal operation mode or said second control signal is indicative of the first electric current mode, otherwise said second controller generating a signal of logic "A," and (c) said generator comprises:

(i') a first generation section which receives the output from said input means and generates a logic signal identical in logic value with the output of said input means at a second electric current level, (ii') a second generation section, connected to an output of said first controller, which generates either a current of a first electric current level if said first controller provides a signal of logic "A" or a high impedance if said first control provides a signal of the reverse of logic "A," and (iii') a third generation section, connected to an output of said second controller, which generates either a current of said first electric current level if said second controller provides a signal of the reverse of logic "A" or a high impedance if said second control provides a signal of logic "A."

10. A test circuit as in claim 3, wherein said test signal generation means further includes a test pattern generation means for generating test patterns which are provided inside said integrated circuit and outside said output pad circuit.

* * * * *